US012813123B2

(12) United States Patent
Jang et al.

(10) Patent No.: US 12,813,123 B2
(45) Date of Patent: Nov. 24, 2026

(54) DISPLAY APPARATUS INCLUDING AUXILIARY ELECTRODE CONTACTED THROUGH CONTACT HOLE

(71) Applicant: Samsung Display Co., Ltd., Yongin-si (KR)

(72) Inventors: Kyeongwoo Jang, Yongin-si (KR); Sewan Son, Yongin-si (KR); Jiseon Lee, Yongin-si (KR); Kwanhee Lee, Yongin-si (KR); Seunghyun Lee, Yongin-si (KR); Sugwoo Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 384 days.

(21) Appl. No.: 18/398,318

(22) Filed: Dec. 28, 2023

(65) Prior Publication Data

US 2024/0237459 A1 Jul. 11, 2024

(30) Foreign Application Priority Data

Jan. 5, 2023 (KR) ........................ 10-2023-0001946

(51) Int. Cl.

| | |
|---|---|
| ***H10K 59/35*** | (2023.01) |
| ***H10K 59/122*** | (2023.01) |
| ***H10K 59/123*** | (2023.01) |
| ***H10K 59/131*** | (2023.01) |

(52) U.S. Cl.

CPC ......... *H10K 59/353* (2023.02); *H10K 59/122* (2023.02); *H10K 59/123* (2023.02); *H10K 59/131* (2023.02)

(58) Field of Classification Search

CPC .. H10K 59/353; H10K 59/122; H10K 59/123; H10K 59/131; H10K 50/824; H10K 59/35; H10K 59/805; H10K 59/80516; H10K 59/80522; H10K 59/124; H10K 59/351; H10K 59/352; G09F 9/335

See application file for complete search history.

(56) References Cited

U.S. PATENT DOCUMENTS

| | | | | |
|---|---|---|---|---|
| 10,720,590 | B2 * | 7/2020 | Seo | H10K 59/1315 |
| 10,910,590 | B2 | 2/2021 | Harikrishna Mohan et al. | |
| 11,348,983 | B1 * | 5/2022 | Choung | H10K 59/80522 |
| 12,013,618 | B2 * | 6/2024 | Xian | G02F 1/155 |
| 12,453,254 | B2 * | 10/2025 | Zhou | H10K 59/80522 |
| 2022/0181399 | A1 | 6/2022 | Shim | |
| 2022/0199729 | A1 | 6/2022 | Yun et al. | |

FOREIGN PATENT DOCUMENTS

| | | |
|---|---|---|
| KR | 20220080492 A | 6/2022 |
| KR | 20220089795 A | 6/2022 |

* cited by examiner

*Primary Examiner* — Tan N Tran

(74) *Attorney, Agent, or Firm* — CANTOR COLBURN LLP

(57) ABSTRACT

A display apparatus including a substrate, a first sub-pixel electrode disposed over the substrate, a metal bank layer overlapping the first sub-pixel electrode, an inorganic bank layer disposed on the first sub-pixel electrode and disposed under the metal bank layer, and an auxiliary electrode overlapping the metal bank layer in the non-sub-pixel area, wherein a bottom surface of the inorganic bank layer is in contact with the auxiliary electrode through a first contact hole.

20 Claims, 21 Drawing Sheets

DISPLAY APPARATUS INCLUDING AUXILIARY ELECTRODE CONTACTED THROUGH CONTACT HOLE

CROSS-REFERENCE TO RELATED APPLICATION

This application claims priority to Korean Patent Application No. 10-2023-0001946, filed on Jan. 5, 2023, and all the benefits accruing therefrom under 35 U.S.C. § 119, the content of which in its entirety is herein incorporated by reference.

BACKGROUND

1. Field

The disclosure relates to a structure of a display apparatus.

2. Description of the Related Art

A display apparatus visually displays data. The display apparatus may include a substrate divided into a display area and a peripheral area. A scan line is insulated from a data line in the display area, and a plurality of sub-pixels may be arranged in the display area. Additionally, a thin-film transistor and a pixel electrode electrically connected to the thin-film transistor may be provided in the display area and in correspondence with each of the sub-pixels. In addition, an opposite electrode may be provided in the display area, where the opposite electrode is commonly provided to the pixels. Various wirings, a scan driver, a data driver, a controller, a pad portion, and the like, configured to transfer electrical signals to the display area, may be provided in the peripheral area.

The usage of display apparatuses over time have diversified. Accordingly, various attempts have been made to make designs to improve the quality of display apparatuses.

SUMMARY

One or more embodiments may include a display apparatus with improved resolution, where the display apparatus may be capable of implementing images of excellent quality. However, such a technical problem is an example, and the disclosure is not limited thereto.

According to one or more embodiments, a display apparatus may include a substrate including a plurality of sub-pixel areas and a non-sub-pixel area surrounding each of the plurality of sub-pixel areas, wherein the plurality of sub-pixel areas respectively correspond to a plurality of sub-pixels including a first sub-pixel, a second sub-pixel, and a third sub-pixel respectively configured to emit light of different colors, a first sub-pixel electrode disposed over the substrate, a metal bank layer including a first opening, a first metal layer, and a second metal layer on the first metal layer, wherein the first opening may overlap the first sub-pixel electrode, an inorganic bank layer disposed on the first sub-pixel electrode and disposed under the metal bank layer, a first intermediate layer overlapping the first sub-pixel electrode through the first opening of the metal bank layer, a first opposite electrode disposed on the first intermediate layer through the first opening of the metal bank layer, and an auxiliary electrode overlapping the metal bank layer in the non-sub-pixel area, wherein a bottom surface of the inorganic bank layer is in contact with the auxiliary electrode through a first contact hole.

In an embodiment, the display apparatus may further include a thin-film transistor disposed on the substrate, a first organic insulating layer covering the thin-film transistor, a connection electrode disposed on the first organic insulating layer to electrically connect the thin-film transistor and the first sub-pixel electrode to each other, and a second organic insulating layer disposed between the connection electrode and the first sub-pixel electrode.

In an embodiment, the first contact hole may pass through the second organic insulating layer.

In an embodiment, the auxiliary electrode may include a material identical to a material of the connection electrode and may be disposed on a same layer as a layer on which the connection electrode is disposed.

In an embodiment, the display apparatus may further include a first wiring including a material identical to a material of a source electrode and/or a drain electrode of the thin-film transistor and may be disposed on substantially the same layer as a layer on which the source electrode and/or the drain electrode is disposed, wherein the auxiliary electrode may be connected to the first wiring through a second contact hole, and the second contact hole may pass through the first organic insulating layer.

In an embodiment, the display apparatus may further include a second sub-pixel electrode, a second intermediate layer overlapping the second sub-pixel electrode through a second opening of the metal bank layer, and a second opposite electrode overlapping the second intermediate layer through the second opening of the metal bank layer, wherein the auxiliary electrode may be disposed between the first sub-pixel electrode and the second sub-pixel electrode.

In an embodiment, the inorganic bank layer may extend to cover an end of the first sub-pixel electrode and an end of the second sub-pixel electrode.

In an embodiment, the first sub-pixel and the third sub-pixel may be alternately arranged along a first row in a first direction, the second sub-pixel may be arranged along a second row in a direction parallel to the first row in the first direction, and the second sub-pixel may be alternately arranged with the first sub-pixel and the third sub-pixel. In an embodiment, in the non-sub-pixel area, the auxiliary electrode may extend in a zigzag pattern shape in the first direction in a plan view.

In an embodiment, the first contact hole may be disposed such that a hole is drilled into a portion of a pattern in which the auxiliary electrode is arranged.

In a plan view, an embodiment of the first contact hole may be arranged in a straight line form along a pattern in which the auxiliary electrode is arranged.

In an embodiment, the first opposite electrode may be in direct contact with a lateral surface of the metal bank layer facing the first opening.

In an embodiment, a portion of the second metal layer facing the first opening of the metal bank layer may include a tip which extends to the first opening from a point at which a bottom surface of the second metal layer contacts a lateral surface of the first metal layer.

In an embodiment, the display apparatus may further include a conductive protective layer disposed between the inorganic bank layer and an outer portion of the first sub-pixel electrode, where the conductive protective layer may include a transparent conductive oxide.

In an embodiment, the display apparatus may further include a first dummy intermediate layer including a material identical to a material of the first intermediate layer, and disposed on the second metal layer, and a first dummy opposite electrode including a material identical to a material of the first opposite electrode, and disposed on the first dummy intermediate layer.

According to one or more embodiments, a display apparatus may include a substrate including a plurality of sub-pixel areas and a non-sub-pixel area surrounding each of the plurality of sub-pixel areas, where the plurality of sub-pixel areas respectively correspond to a plurality of sub-pixels including a first sub-pixel, a second sub-pixel, and a third sub-pixel respectively configured to emit light of different colors, a first organic insulating layer disposed on the substrate, a connection electrode disposed on the first organic insulating layer, an auxiliary electrode disposed on the first organic insulating layer and disposed adjacent to the connection electrode, a second organic insulating layer disposed to cover the connection electrode and the auxiliary electrode, a sub-pixel electrode disposed on the second organic insulating layer, an inorganic bank layer including an opening overlapping the sub-pixel electrode, wherein the inorganic bank layer is disposed on the sub-pixel electrode, and a metal bank layer including an opening overlapping the sub-pixel electrode, wherein the metal bank layer is disposed on the inorganic bank layer and includes a first metal layer and a second metal layer on the first metal layer, wherein the sub-pixel electrode is connected to the connection electrode through a via hole of the second organic insulating layer, and the inorganic bank layer is in contact with the auxiliary electrode through a first contact hole of the second organic insulating layer.

In an embodiment, the display apparatus may further include an intermediate layer overlapping the sub-pixel electrode through the opening of the metal bank layer, an opposite electrode disposed on the intermediate layer through the opening of the metal bank layer, a dummy intermediate layer including a material identical to a material of the intermediate layer and disposed on the metal bank layer, and a dummy opposite electrode including a material identical to a material of the opposite electrode, and disposed on the dummy intermediate layer.

In an embodiment, the display apparatus may further include a thin-film transistor disposed between the substrate and the first organic insulating layer, and a first wiring disposed on a same layer as a layer on which a source electrode and/or a drain electrode of the thin-film transistor is disposed, wherein the auxiliary electrode may be electrically connected to the first wiring through a second contact hole of the first organic insulating layer.

In an embodiment, the first contact hole may be disposed such that a hole may be drilled into a portion of a pattern in which the auxiliary electrode is arranged.

In a plan view, in an embodiment, the first contact hole may be arranged in a straight line form along a pattern in which the auxiliary electrode is arranged.

BRIEF DESCRIPTION OF THE DRAWINGS

The above and other aspects, features, and advantages of certain embodiments will be more apparent from the following detailed description taken in conjunction with the accompanying drawings, in which.

DETAILED DESCRIPTION

Figure 1A:
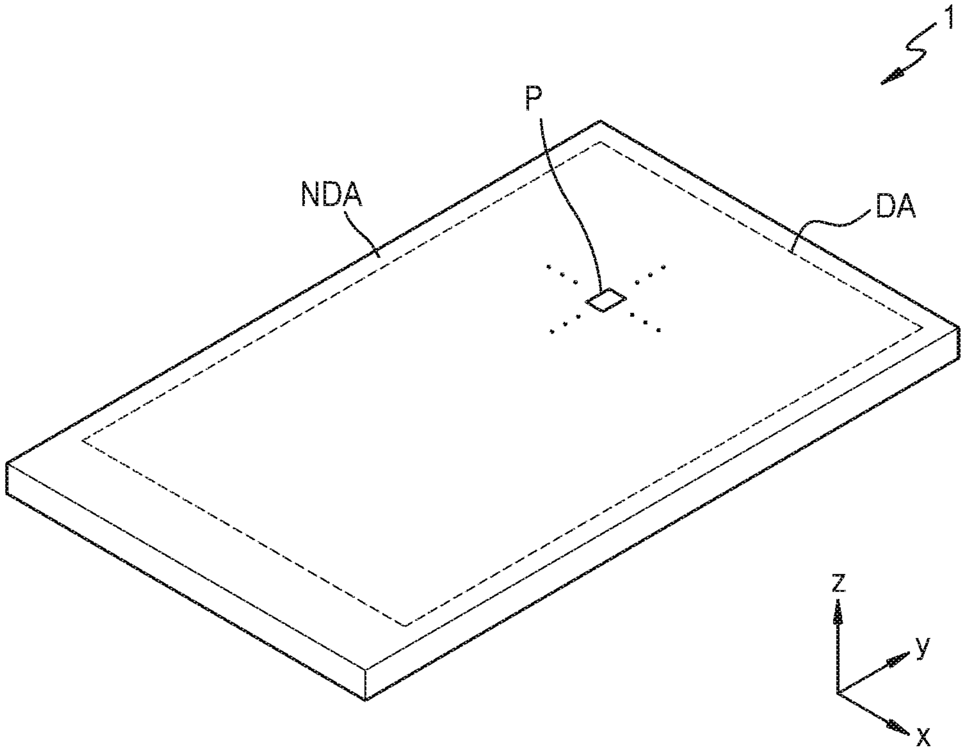
FIG. 1A is a schematic perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects and features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, and/or variations thereof.

As the disclosure allows for various changes and numerous embodiments, certain embodiments will be illustrated in the drawings and described in the disclosure. Effects and features of the disclosure, and methods for achieving them may be clarified with reference to embodiments described below in detail with reference to the drawings. However, the disclosure is not limited to the embodiments disclosed herein and may be embodied in various forms.

Hereinafter, embodiments may be described with reference to the accompanying drawings, wherein like reference numerals refer to like elements throughout and a repeated description thereof may be omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of explanation. In an embodiment, as an example, the size and thickness of each element shown in the drawings may be arbitrarily represented for convenience of description, and thus, the disclosure is not limited thereto.

In the case where a certain embodiment may be implemented differently, a specific process order may be performed in the order different from the described order. In an embodiment, as an example, two processes successively described may be simultaneously performed substantially and performed in the opposite order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or element is referred to as being "electrically connected" to another layer, region, or element, it may be "directly electrically connected" to the other layer, region, or element or may be "indirectly electrically connected" to other layer, region, or element with other layer, region, or element interposed therebetween.

As used herein, the term "and/or" includes all of one or more combinations defined by related components.

Terms such as first, second, and the like may be used to describe various components, but the components should not be limited by the terms. The terms may be used for distinguishing one component from other components. For example, without departing the scope of the disclosure, a first component may be referred to as a second component, and similarly, the second component may also be referred to as the first component. The terms of a singular form may include plural forms unless otherwise specified.

In addition, terms such as "below", "under", "above", and "over" may be used to describe a relationship of components illustrated in the drawings. The terms may be relative concepts and may be described based on directions illustrated in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms used herein, including technical or scientific terms, have the same meanings as those generally understood by those skilled in the art to which the disclosure pertains. Such terms as those defined in a generally used dictionary should be interpreted as having meanings equal to the contextual meanings in the relevant field of art, and should not be interpreted as having ideal or excessively formal meanings unless clearly defined as having such in the present application.

Hereinafter, embodiments of the disclosure will be described with reference to the accompanying drawings.

Figure 1B:
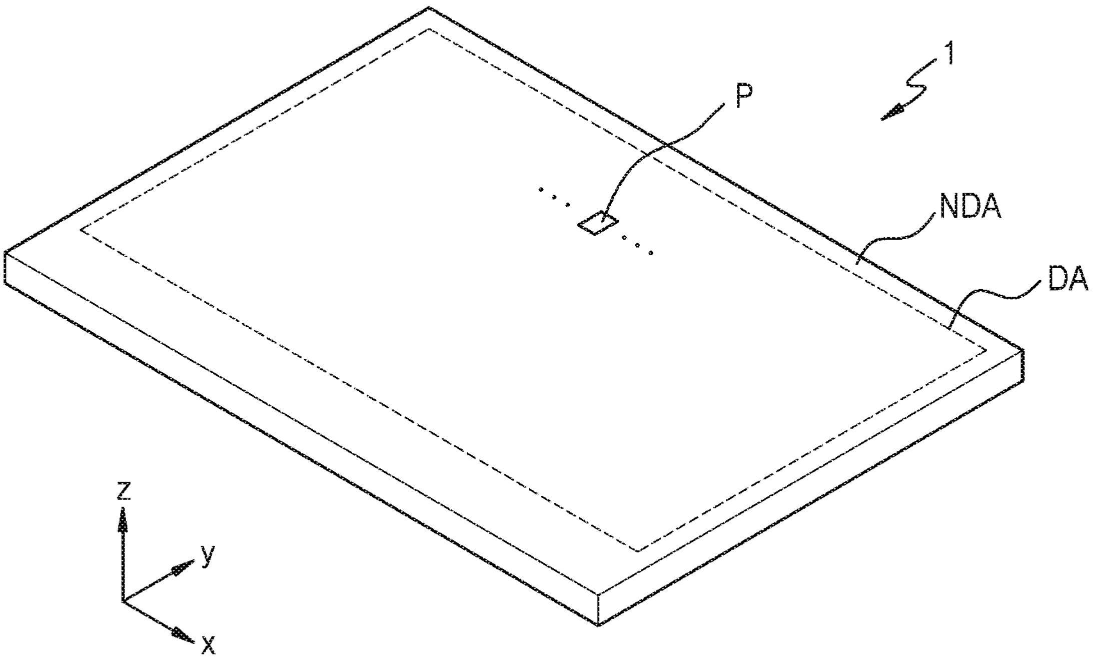
FIG. 1B is a schematic perspective view of a display apparatus according to an embodiment.

FIGS. 1A and 1B are schematic perspective views of a display apparatus 1 according to an embodiment.

Referring to FIGS. 1A and 1B, an embodiment of the display apparatus 1 may include a display area DA and a non-display area NDA outside of the display area DA. The display area DA may be configured to display images through sub-pixels P arranged in the display area DA. The non-display area NDA may be arranged outside of the display area DA and does not display images. In an embodiment, the non-display area NDA may surround the display area DA entirely. A driver and the like configured to provide electrical signals or power to the display area DA may be arranged in the non-display area NDA. A pad may be arranged in the non-display area NDA, wherein the pad may be a region to which electronic elements or a printed circuit board may be electrically connected.

In an embodiment, FIG. 1A shows that the display area DA is a polygon (e.g., a quadrangle) in which a length thereof in an x direction is less than a length thereof in a y direction. In an embodiment, FIG. 1B shows that the display area DA is a polygon (e.g., a quadrangle) in which a length thereof in the y direction is less than a length thereof in the x direction. Although FIGS. 1A and 1B show the display area DA as an approximately quadrangle, the embodiment is not limited thereto. As another embodiment, the display area DA may have various shapes such as an N-gon (where N is a natural number of 3 or more), a circle, and/or an ellipse. Although it is shown in FIGS. 1A and 1B that the display area DA may have a shape in which a corner of the display area DA may include a vertex at which a straight line meets a straight line, the display area DA may have a polygon having round corners/borders.

Hereinafter, for convenience of description, although the embodiment where the display apparatus 1 is a smartphone is described, the display apparatus 1 according to an embodiment is not limited thereto. In an embodiment, the display apparatus 1 may be applicable to various products including televisions, notebook computers, monitors, advertisement boards, Internet of things (IoTs) as well as portable electronic apparatuses including mobile phones, smart phones, tablet personal computers (PCs), mobile communication terminals, electronic organizers, electronic books, portable multimedia players (PMPs), navigations, and/or ultra mobile personal computers (UMPCs). In addition, the display apparatus 1 according to an embodiment may be applicable to wearable devices including smartwatches, watchphones, glasses-type displays, and/or head-mounted displays (HMDs). In addition, in an embodiment, the display apparatus 1 may be applicable to a display screen in instrument panels for automobiles, a center fascia for an automobile, and/or center information displays (CIDs) arranged on a dashboard, room mirror displays that replace side mirrors of automobiles, and/or displays of an entertainment system arranged on the backside of front seats for backseat passengers in automobiles.

Figure 2A:
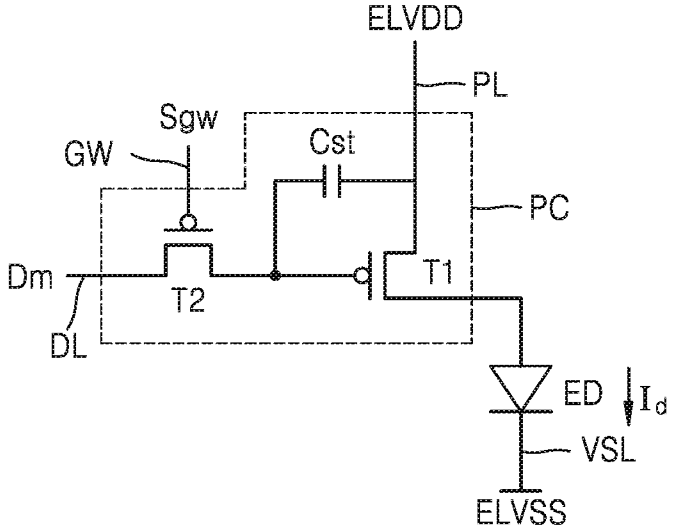
FIG. 2A is a schematic equivalent circuit diagram of a light-emitting diode corresponding to one of the sub-pixels of the display apparatus and a sub-pixel circuit electrically connected to a relevant light-emitting diode, according to an embodiment.
Figure 2B:
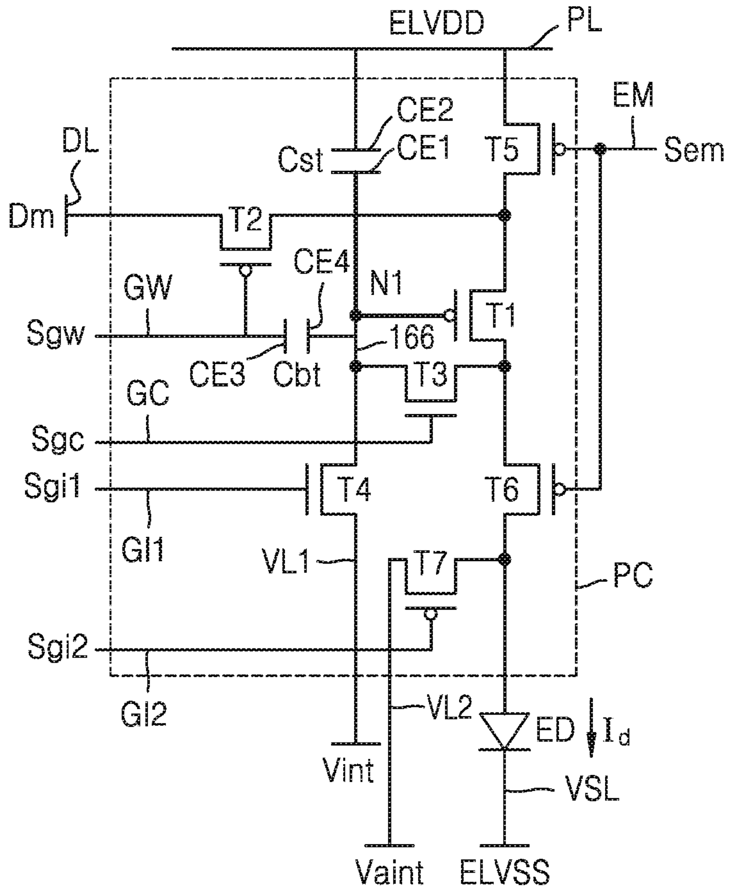
FIG. 2B is a schematic equivalent circuit diagram of a light-emitting diode corresponding to one of sub-pixels of the display apparatus and a sub-pixel circuit electrically connected to a relevant light-emitting diode, according to an embodiment.

FIGS. 2A and 2B are schematic equivalent circuit diagrams of a light-emitting diode corresponding to sub-pixels of the display apparatus 1 and a sub-pixel circuit connected to a relevant light-emitting diode according to an embodiment.

Referring to FIG. 2A, an embodiment of a light-emitting diode ED may be electrically connected to a sub-pixel circuit PC, and the sub-pixel circuit PC may include a first transistor T1, a second transistor T2, and a storage capacitor Cst. In an embodiment, a sub-pixel electrode (e.g., an anode) of the light-emitting diode ED may be electrically connected to the first transistor T1, and an opposite electrode (e.g., a cathode) may be electrically connected to an auxiliary line VSL and may receive a voltage corresponding to a common voltage ELVSS through the auxiliary line VSL.

In an embodiment, the second transistor T2 may be configured to transfer a data signal Dm to the first transistor T1 according to a scan signal Sgw input through a scan line GW, wherein the data signal Dm is input through a data line DL.

In an embodiment, the storage capacitor Cst may be connected to the second transistor T2 and a driving voltage line PL and may store a voltage corresponding to a difference between a voltage transferred from the second transistor T2 and a driving voltage ELVDD supplied to the driving voltage line PL.

In an embodiment, the first transistor T1 may be connected to the driving voltage line PL and the storage capacitor Cst and may control a driving current $I_d$ according to the voltage stored in the storage capacitor Cst, the driving current $I_d$ flowing from the driving voltage line PL to the light-emitting diode ED. In an embodiment, the light-emitting diode ED may emit light having a preset brightness corresponding to the driving current $I_d$.

Although it is described with reference to FIG. 2A that the sub-pixel circuit PC includes two transistors T1, T2 and one storage capacitor Cst, the embodiment is not limited thereto.

Referring to FIG. 2B, in an embodiment, the sub-pixel circuit PC may include seven transistors and two capacitors.

In an embodiment, the sub-pixel circuit PC may include first to seventh transistors T1, T2, T3, T4, T5, T6, and T7, respectively, a storage capacitor Cst, and a boost capacitor Cbt. In another embodiment, the sub-pixel circuit PC may not include the boost capacitor Cbt. In another embodiment, a sub-pixel electrode (e.g., an anode) of the light-emitting diode ED may be electrically connected to the first transistor T1 through the sixth transistor T6, and an opposite electrode (e.g., a cathode) may be electrically connected to the auxiliary line VSL and may receive a voltage corresponding to the common voltage ELVSS through the auxiliary line VSL.

In an embodiment, some of the transistors T1, T2, T3, T4, T5, T6, and T7 may be n-channel metal oxide semiconductor (NMOS) field-effect transistors (n-channel MOSFETs), and the rest may be p-channel metal oxide semiconductor (PMOS) field-effect transistors (p-channel MOSFETs). In an embodiment, as shown in FIG. 2B, the third and fourth transistors T3 and T4 may be n-channel MOSFETs, and the rest may be p-channel MOSFETs. In an embodiment, as an example, the third and fourth transistors T3 and T4 may be n-channel MOSFETs including an oxide-based semiconductor material, and the rest may be p-channel MOSFETs including a silicon-based semiconductor material. In another embodiment, the third, fourth, and seventh transistors T3, T4, and T7 may be n-channel MOSFETs, and the rest may be p-channel MOSFETs.

In an embodiment, the first to seventh transistors T1, T2, T3, T4, T5, T6, and T7, respectively, the storage capacitor Cst, and the boost capacitor Cbt may be connected to signal lines. In an embodiment, the signal lines may include an emission control line EM, a compensation gate line GC, a first initialization gate line GI1, a second initialization gate line GI2, and the data line DL. In an embodiment, the sub-pixel circuit PC may be electrically connected to a voltage line, for example, the driving voltage line PL, a first initialization voltage line VL1, and a second initialization voltage line VL2.

In an embodiment, the first transistor T1 may be a driving transistor. A first gate electrode of the first transistor T1 may be connected to the storage capacitor Cst, a first electrode of the first transistor T1 may be electrically connected to the driving voltage line PL through the fifth transistor T5, and a second electrode of the first transistor T1 may be electrically connected to a first electrode (e.g., an anode) of the light-emitting diode ED through the sixth transistor T6. In an embodiment, one of the first electrode and the second electrode of the first transistor T1 may be a source electrode, and the other may be a drain electrode. In an embodiment, the first transistor T1 may be configured to supply the driving current $I_d$ to the light-emitting diode ED according to a switching operation of the second transistor T2.

In an embodiment, the second transistor T2 may be a switching transistor. In an embodiment, a second gate electrode of the second transistor T2 is connected to the scan line GW, a first electrode of the second transistor T2 is connected to the data line DL, and a second electrode of the second transistor T2 is connected to the driving first electrode of the first transistor T1 and electrically connected to the driving voltage line PL through the fifth transistor T5. In an embodiment, one of the first electrode and the second electrode of the second transistor T2 may be a source electrode, and the other may be a drain electrode. In an embodiment, the second transistor T2 may be turned on according to a scan signal Sgw transferred through the scan line GW and may perform a switching operation of transferring a data signal Dm to the first electrode of the first transistor T1, wherein the data signal Dm may be transferred through the data line DL.

In an embodiment, the third transistor T3 may be a compensation transistor configured to compensate for a threshold voltage of the first transistor T1. A third gate electrode of the third transistor T3 may be connected to a compensation gate line GC. A first electrode of the third transistor T3 may be connected to a lower electrode CE1 of the storage capacitor Cst through a node connection line 166 and connected to the first gate electrode of the first transistor T1. The first electrode of the third transistor T3 may be connected to the fourth transistor T4. A second electrode of the third transistor T3 may be connected to the second electrode of the first transistor T1 and electrically connected to the first electrode (e.g., the anode) of the light-emitting diode ED through the sixth transistor T6. One of the first electrode and the second electrode of the third transistor T3 may be a source electrode, and the other may be a drain electrode.

In an embodiment, the third transistor T3 may be turned on according to a compensation signal Sgc transferred through the compensation gate line GC, and diode-connects the first transistor T1 by electrically connecting the first gate electrode to the second electrode (e.g., a drain electrode) of the first transistor T1.

In an embodiment, the fourth transistor T4 may be a first initialization transistor configured to initialize the first gate electrode of the first transistor T1. A fourth gate electrode of the fourth transistor T4 may be connected to a first initialization gate line GI1. A first electrode of the fourth transistor T4 is connected to a first initialization voltage line VL1. A second electrode of the fourth transistor T4 may be connected to the lower electrode CE1 of the storage capacitor Cst, the first electrode of the third transistor T3, and the first gate electrode of the first transistor T1. One of the first electrode and the second electrode of the fourth transistor T4 may be a source electrode, and the other may be a drain electrode. In an embodiment, the fourth transistor T4 may be turned on according to a first initialization signal Sgi1 transferred through the first initialization gate line GI1 and may perform an initialization operation of initializing the voltage of the first gate electrode of the first transistor T1 by transferring the first initialization voltage Vint to the first gate electrode of the driving transistor T1.

In an embodiment, the fifth transistor T5 may be an operation control transistor. A fifth gate electrode of the fifth transistor T5 may be connected to the emission control line EM, a first electrode of the fifth transistor T5 may be connected to the driving voltage line PL, and a second electrode of the fifth transistor T5 is connected to the first electrode of the first transistor T1 and the second electrode of the second transistor T2. In an embodiment, one of the first electrode and the second electrode of the fifth transistor T5 may be a source electrode, and the other may be a drain electrode.

In an embodiment, the sixth transistor T6 may be an emission control transistor. A sixth gate electrode of the sixth transistor T6 may be connected to the emission control line EM, a first electrode of the sixth transistor T6 may be connected to the second electrode of the first transistor T1 and the second electrode of the third transistor T3, and a second electrode of the sixth transistor T6 is electrically connected to a second electrode of the seventh transistor T7 and the first electrode (e.g., the anode) of the light-emitting diode ED. One of the first electrode and the second electrode of the sixth transistor T6 may be a source electrode, and the other may be a drain electrode.

In an embodiment, the fifth transistor T5 and the sixth transistor T6 may be simultaneously turned on according to an emission control signal Sem transferred through the emission control line EM, the driving voltage ELVDD is transferred to the light-emitting diode ED, and the driving current $I_d$ flows through the light-emitting diode ED.

In an embodiment, the seventh transistor T7 may be a second initialization transistor configured to initialize the first electrode of the light-emitting diode ED. A seventh gate electrode of the seventh transistor T7 may be connected to a second initialization gate line GI2. A first electrode of the seventh transistor T7 may be connected to the second initialization voltage line VL2. A second electrode of the seventh transistor T7 may be connected to the second electrode of the sixth transistor T6 and the first electrode (e.g., the anode) of the light-emitting diode ED. In an embodiment, the seventh transistor T7 may be turned on according to a second initialization signal Sgi2 transferred through the second initialization gate line GI2, and configured to initialize the first electrode of the light-emitting diode ED by transferring a second initialization voltage Vaint to the first electrode (e.g., the anode) of the light-emitting diode ED.

In an embodiment, the second initialization voltage line VL2 may be a next scan line. In an embodiment, as an example, the second initialization gate line GI2 connected to the seventh transistor T7 of the sub-pixel circuit PC and arranged in an i-th row (i is a natural number), may correspond to a scan line of the sub-pixel circuit PC arranged in an (i+1)-th row. In another embodiment, the second initialization voltage line VL2 may be the emission control line EM. In an embodiment, as an example, the emission control line EM may be electrically connected to the fifth to seventh transistors T5, T6, and T7, respectively.

The storage capacitor Cst may include the lower electrode CE1 and an upper electrode CE2. The lower electrode CE1 of the storage capacitor Cst may be connected to the first gate electrode of the first transistor T1, and the upper electrode CE2 of the storage capacitor Cst may be connected to the driving voltage line PL. In an embodiment, the storage capacitor Cst may be configured to store charge corresponding to a difference between a voltage of the first gate electrode of the first transistor T1 and the driving voltage ELVDD.

In an embodiment, the boost capacitor Cbt may include a third electrode CE3 and a fourth electrode CE4. The third electrode CE3 may be connected to the second gate electrode of the second transistor T2 and the scan line GW, and the fourth electrode CE4 may be connected to the first electrode of the third transistor T3 and the node connection line 166. The boost capacitor Cbt may raise the voltage of a first node N1 when a scan signal Sgw supplied to the scan line GW is at a turn-off voltage. When the voltage of the first node N1 is raised, a black grayscale may be clearly expressed.

In an embodiment, the first node N1 may be a region where the first gate electrode of the first transistor T1, the first electrode of the third transistor T3, the second electrode of the fourth transistor T4, and the fourth electrode CE4 of the boost capacitor Cbt may be connected to each other.

In an embodiment, it is described in FIG. 2B that the third and fourth transistors T3 and T4, respectively, are n-channel MOSFETs, and the first, second and fifth to seventh transistors T1, T2, T5, T6, and T7, respectively, are p-channel MOSFETs. The first transistor T1 may directly influence the brightness of the display apparatus displaying images and may be configured to include a semiconductor layer including polycrystalline silicon having high reliability, and thus, a high-resolution display apparatus may be implemented through this configuration.

Although it is described in FIG. 2B that, in an embodiment, some of the transistors are NMOSFETs and the rest are PMOSFETs, the embodiment is not limited thereto. In another embodiment, the sub-pixel circuit PC may include three transistors and all of the three transistors may be NMOSFETs. However, various modifications may be made.

Figure 3A:
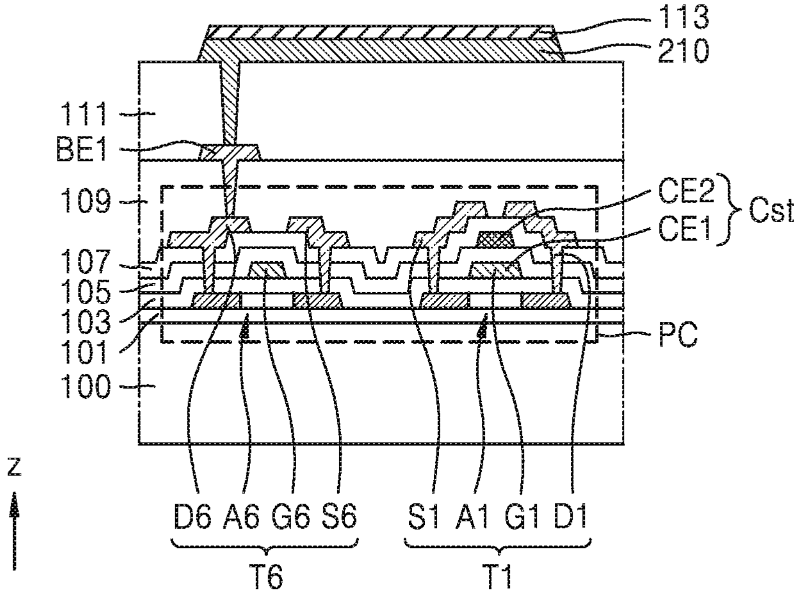
FIG. 3A is a schematic cross-sectional view showing a state corresponding to a process of manufacturing a display apparatus according to an embodiment.
Figure 3B:
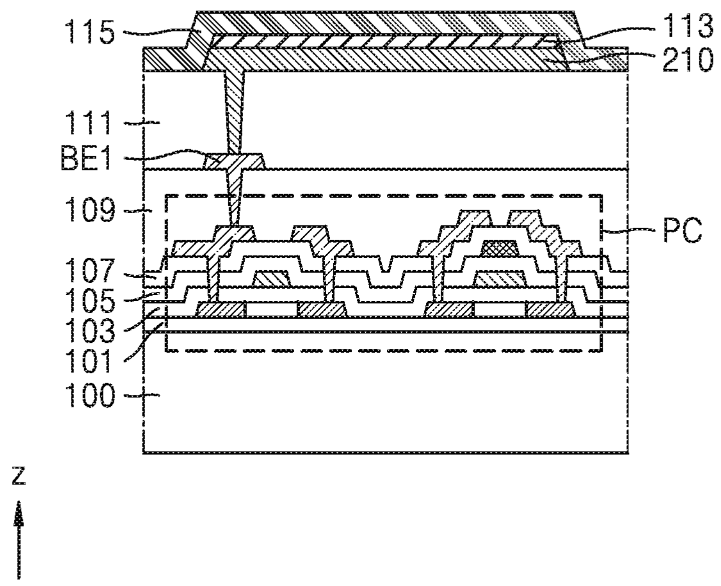
FIG. 3B is a schematic cross-sectional view showing a state corresponding to a process of manufacturing a display apparatus according to an embodiment.
Figure 3C:
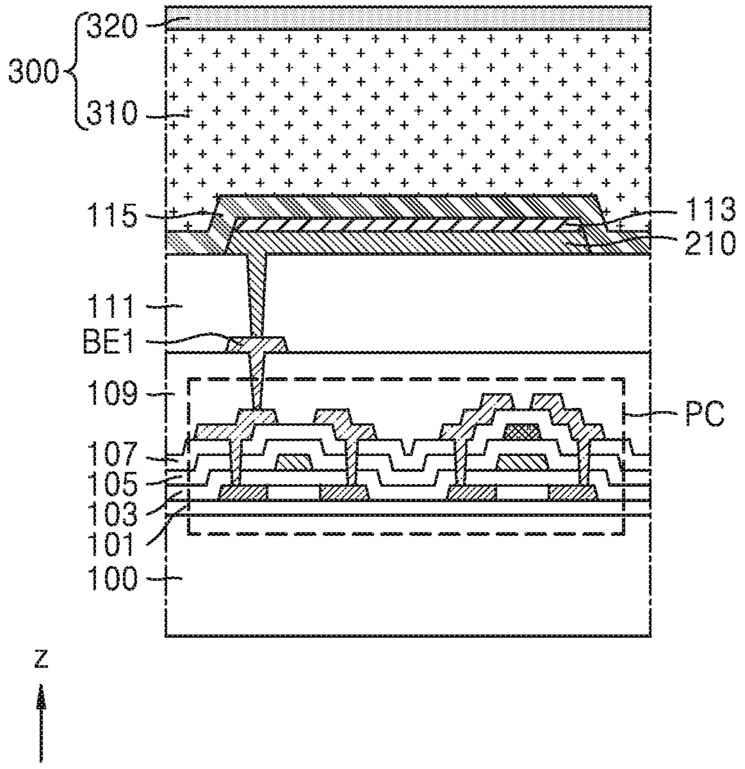
FIG. 3C is a schematic cross-sectional view showing a state corresponding to a process of manufacturing a display apparatus according to an embodiment.
Figure 3D:
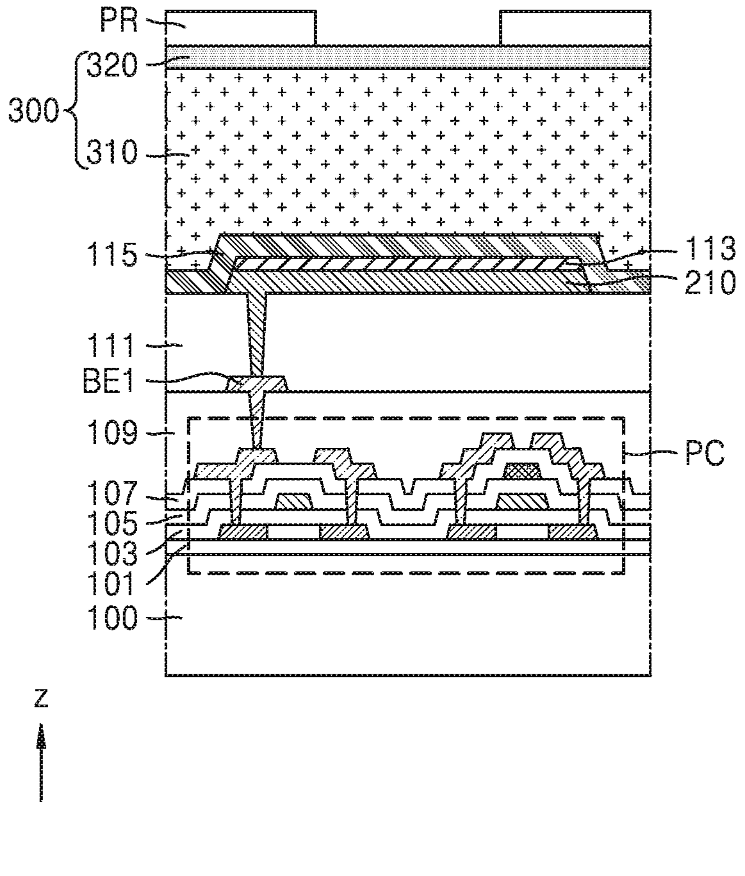
FIG. 3D is a schematic cross-sectional view showing a state corresponding to a process of manufacturing a display apparatus according to an embodiment.
Figure 3E:
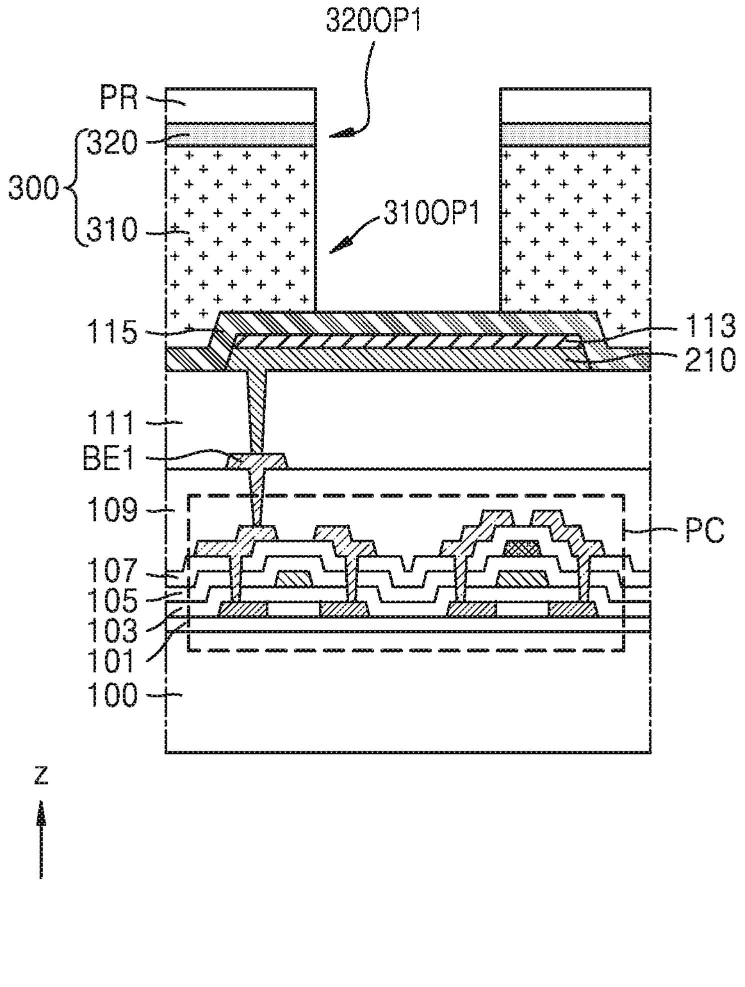
FIG. 3E is a schematic cross-sectional view showing a state corresponding to a process of manufacturing a display apparatus according to an embodiment.
Figure 3F:
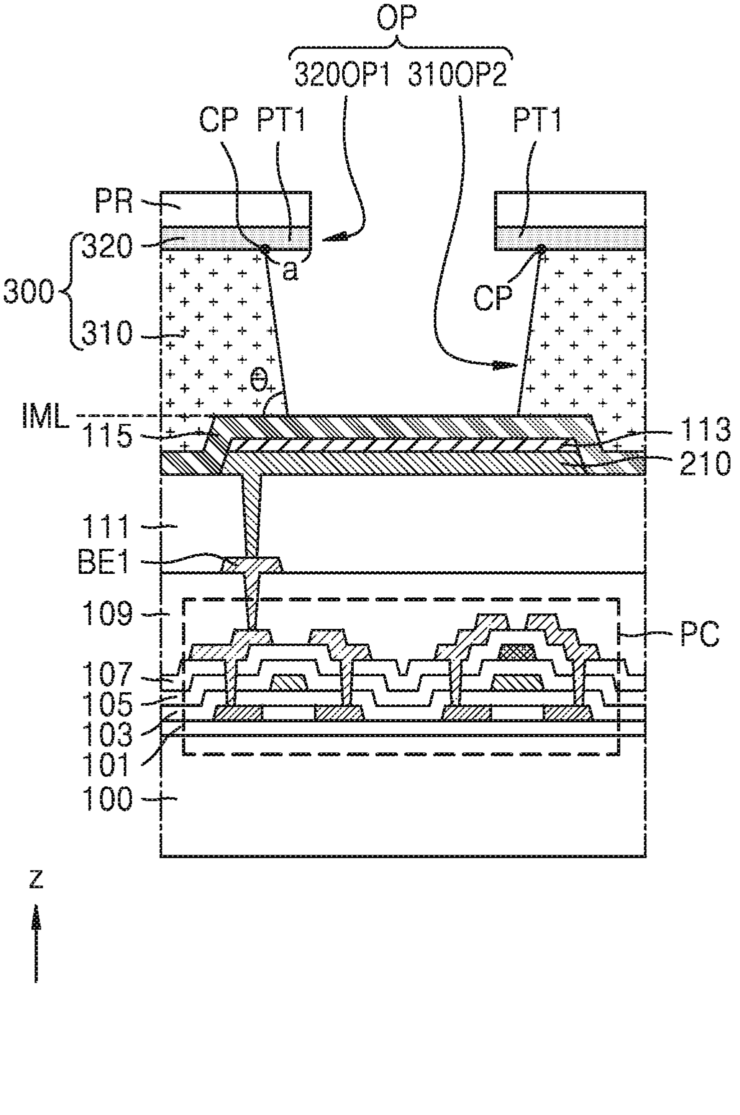
FIG. 3F is a schematic cross-sectional view showing a state corresponding to a process of manufacturing a display apparatus according to an embodiment.
Figure 3G:
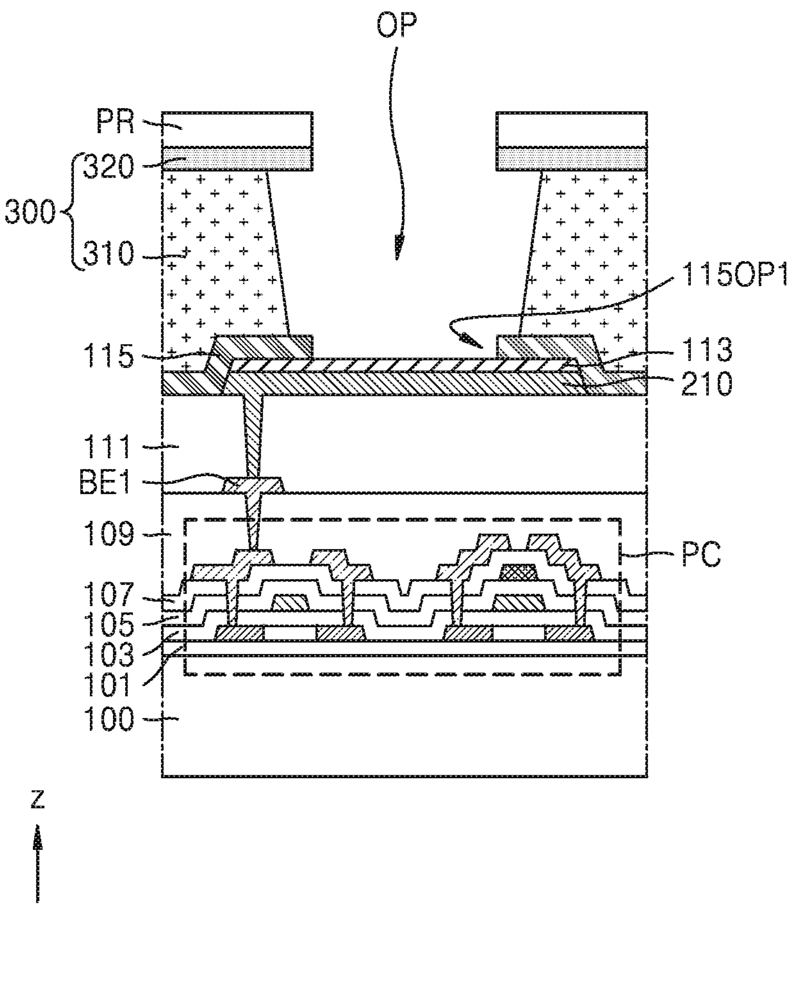
FIG. 3G is a schematic cross-sectional view showing a state corresponding to a process of manufacturing a display apparatus according to an embodiment.
Figure 3H:
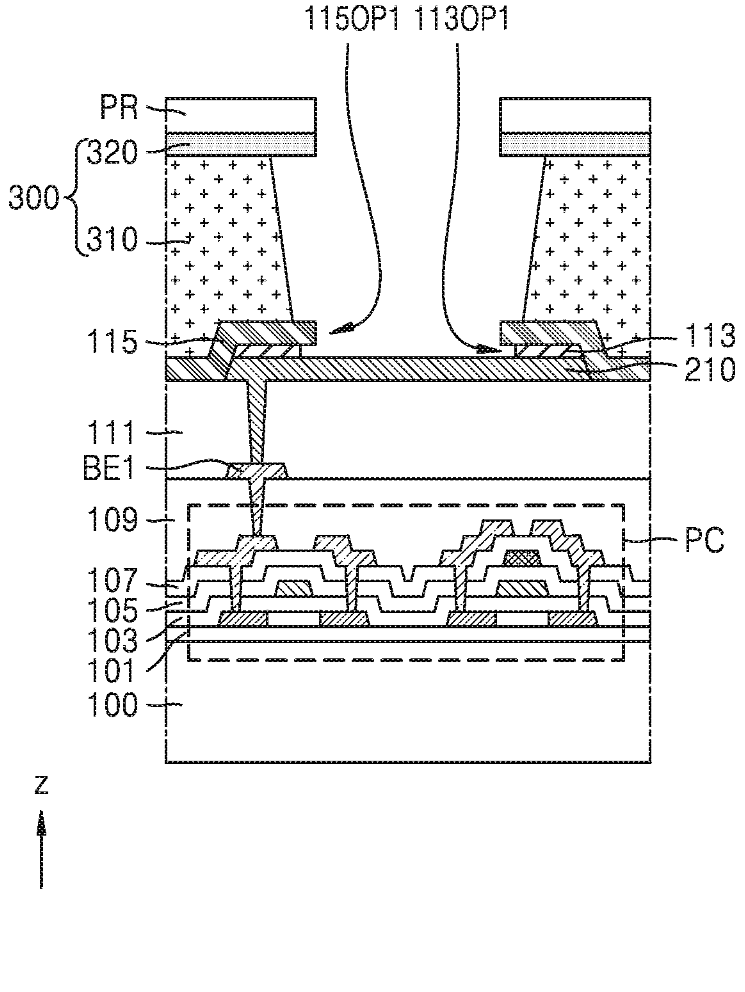
FIG. 3H is a schematic cross-sectional view showing a state corresponding to a process of manufacturing a display apparatus according to an embodiment.
Figure 3I:
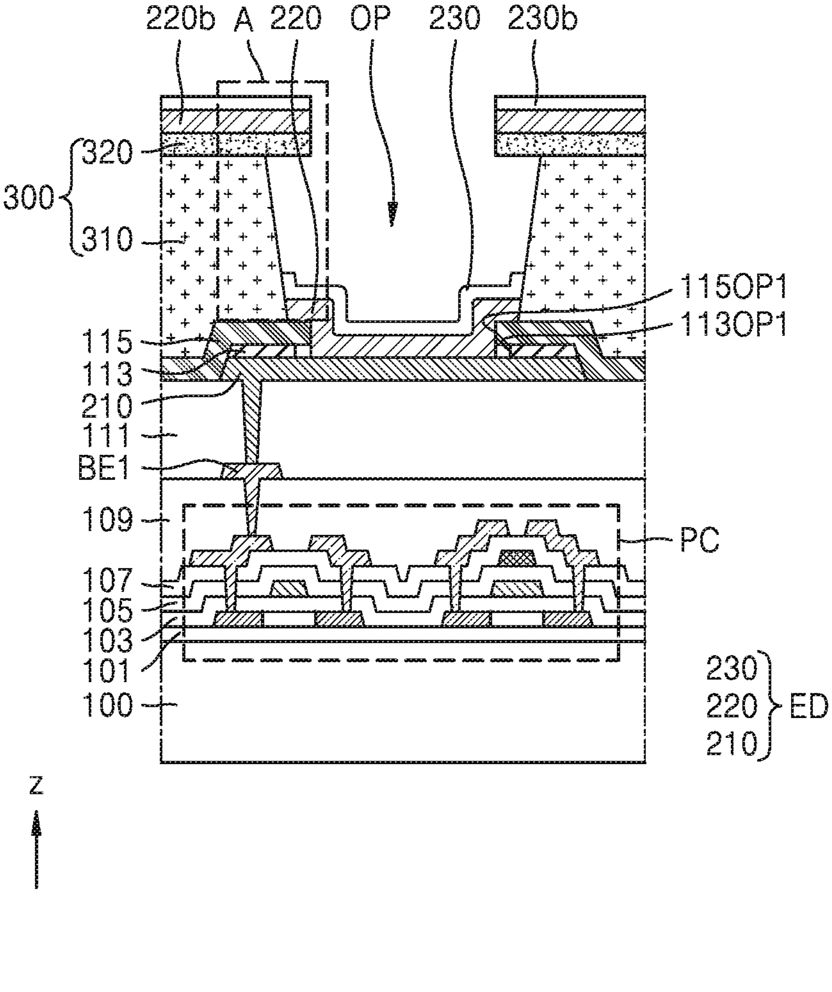
FIG. 3I is a schematic cross-sectional view showing a state corresponding to a process of manufacturing a display apparatus according to an embodiment.
Figure 3J:
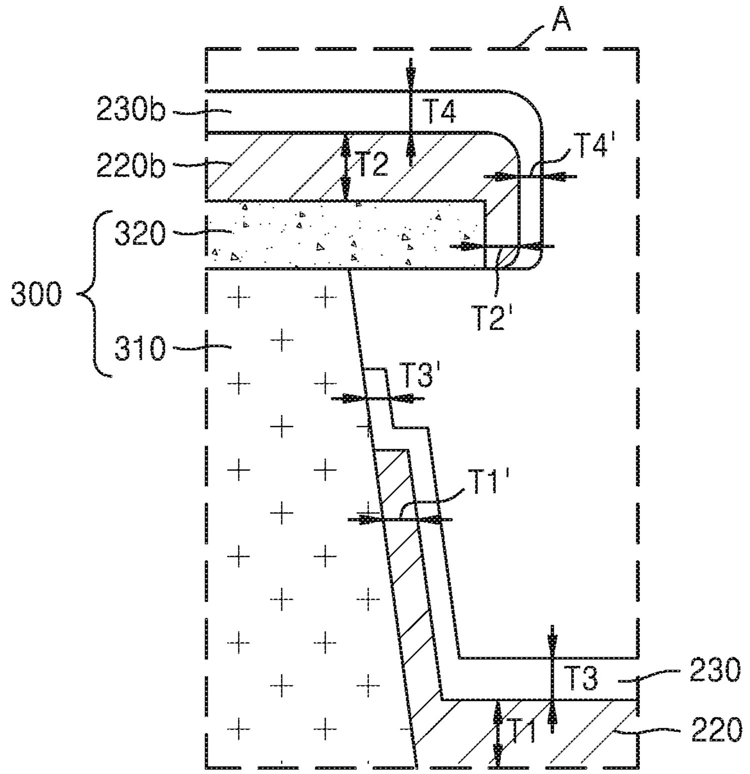
FIG. 3J is a schematic cross-sectional view showing a state corresponding to a process of manufacturing a display apparatus according to an embodiment.
Figure 3K:
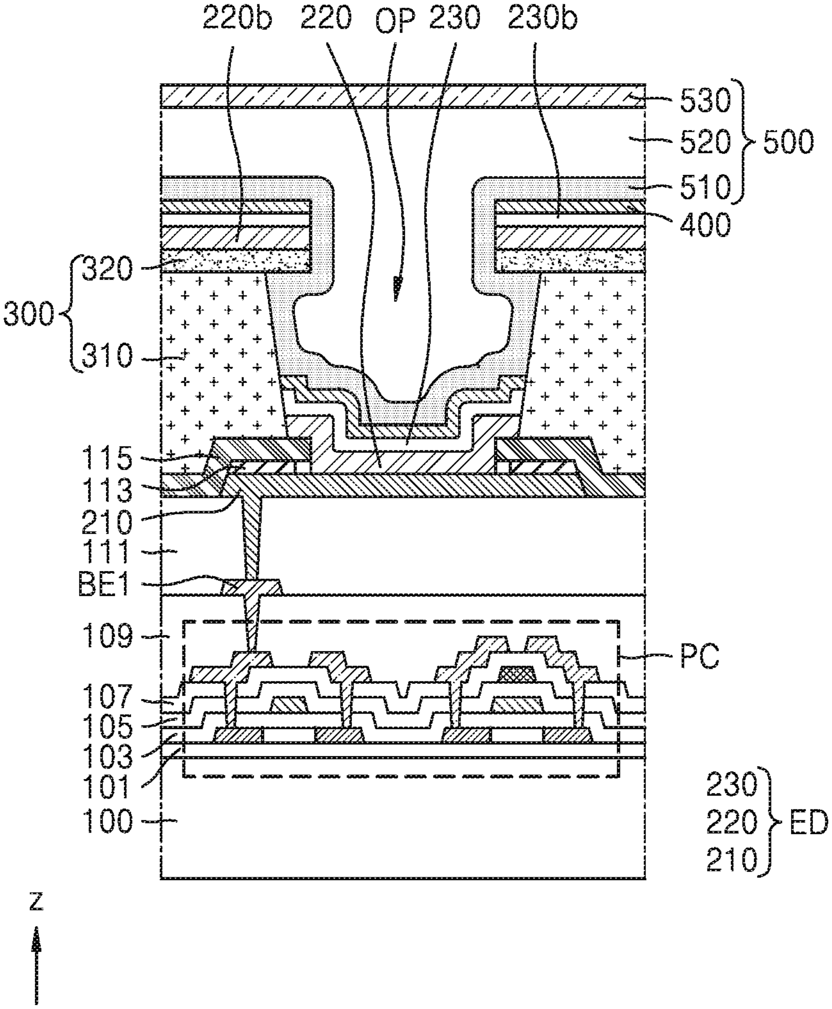
FIG. 3K is a schematic cross-sectional view showing a state corresponding to a process of manufacturing a display apparatus according to an embodiment.
Figure 3L:
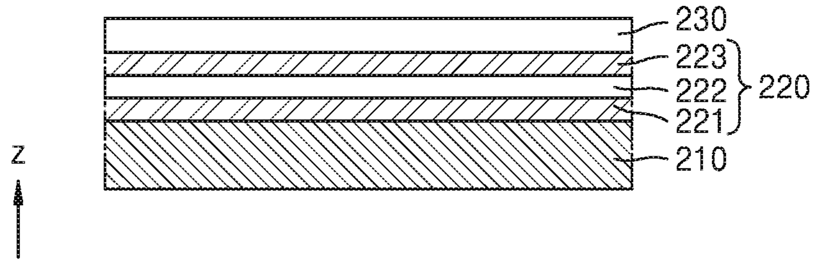
FIG. 3L is a cross-sectional view of a stack structure of a light-emitting diode according to an embodiment.
Figure 3M:
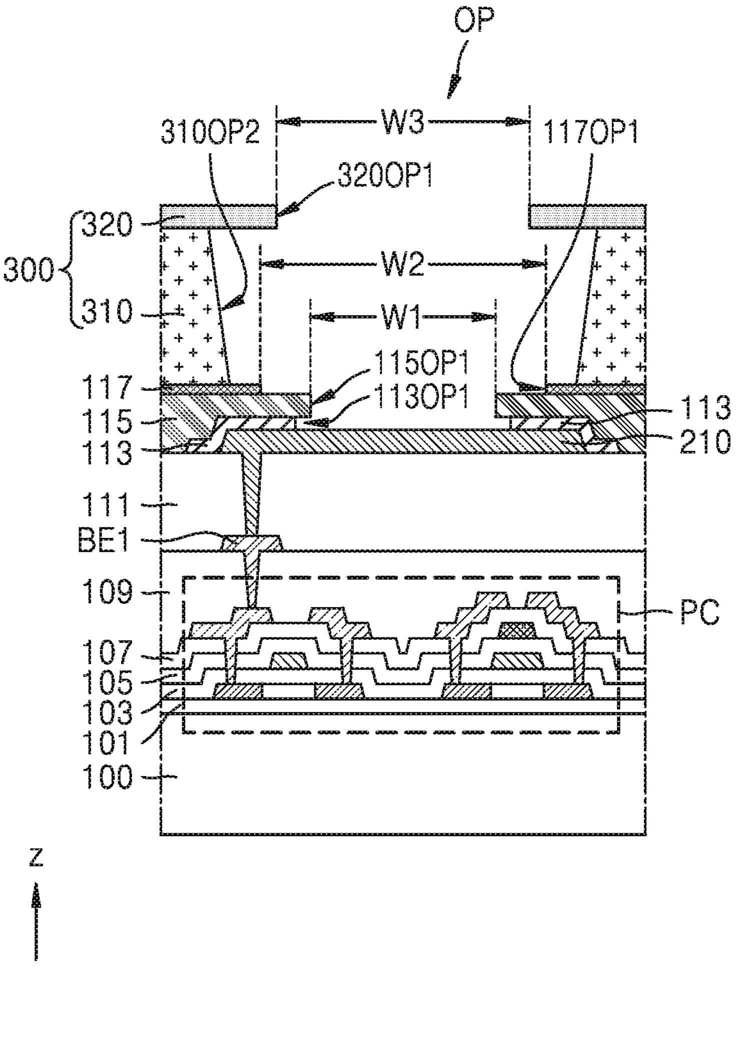
FIG. 3M is a schematic cross-sectional view of a portion of a display apparatus according to another embodiment.

FIGS. 3A to 3K are schematic cross-sectional views showing states corresponding to a process of manufacturing the display apparatus 1 according to an embodiment, and FIG. 3L is a cross-sectional view of a stack structure of a light-emitting diode according to an embodiment. FIG. 3M is a schematic cross-sectional view of a portion of a display apparatus according to another embodiment.

Referring to FIG. 3A, an embodiment of the sub-pixel circuit PC may be formed on the substrate 100. The substrate 100 may include glass or polymer resin. In an embodiment, the substrate 100 may have a structure in which a base layer including polymer resin and an inorganic barrier layer may be stacked. In an embodiment, the polymer resin may include a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate, cellulose tri acetate (TAC), cellulose acetate propionate (CAP), and the like.

In an embodiment, a buffer layer 101 may be disposed on the upper surface of the substrate 100. The buffer layer 101 may prevent impurities from penetrating a semiconductor layer of a transistor. In an embodiment, the buffer layer 101 may include an inorganic insulating material such as silicon nitride, silicon oxynitride, and/or silicon oxide, and include a single layer or a multi-layer including the above inorganic insulating materials.

In an embodiment, the sub-pixel circuit PC may be disposed on the buffer layer 101. As described above with reference to FIG. 2A or 2B, the sub-pixel circuit PC may include the plurality of transistors and/or the storage capacitor. In an embodiment, FIG. 3A shows the first transistor T1, the sixth transistor T6, and the storage capacitor Cst of the sub-pixel circuit PC.

In an embodiment, the first transistor T1 may include a first semiconductor layer A1 and a first gate electrode G1, wherein the first semiconductor layer A1 may be on the buffer layer 101, and the first gate electrode G1 may overlap a channel region of the first semiconductor layer A1. The first semiconductor layer A1 may include a silicon-based semiconductor material, in an embodiment, for example, polycrystalline silicon, and/or the like. In an embodiment, the first semiconductor layer A1 may include a channel region, a first region, and a second region, the first region and the second region being on two opposite sides of the channel region. In an embodiment, the first region and the second region may be regions including impurities of higher concentration than that of the channel region. One of the first region and the second region may correspond to a source region, and the other may correspond to a drain region.

In an embodiment, the sixth transistor T6 may include a sixth semiconductor layer A6 and a sixth gate electrode G6, wherein the sixth semiconductor layer A6 may be on the buffer layer 101, and the sixth gate electrode G6 may overlap a channel region of the sixth semiconductor layer A6. The sixth semiconductor layer A6 may include a silicon-based semiconductor material, in an embodiment, for example, polycrystalline silicon, and/or the like. The sixth semiconductor layer A6 may include a channel region, a first region, and a second region, the first region and the second region being on two opposite sides of the channel region. In an embodiment, the first region and the second region may be regions including impurities of higher concentration than that of the channel region. One of the first region and the second region may correspond to a source region, and the other may correspond to a drain region.

In an embodiment, the first gate electrode G1 and the sixth gate electrode G6 may include a conductive material including molybdenum (Mo), aluminum (Al), copper (Cu), and/or titanium (Ti) and may have a single-layered structure or a multi-layered structure including the above materials. A first gate insulating layer 103 may be disposed below the first gate electrode G1 and the sixth gate electrode G6, wherein the first gate insulating layer 103 may be for electrical insulation between the first semiconductor layer A1 and the first gate electrode G1 and between the sixth semiconductor layer A6 and the sixth gate electrode G6. In an embodiment, the first gate insulating layer 103 may include an inorganic insulating material such as silicon nitride, silicon oxynitride, and/or silicon oxide, and may include a single layer or a multi-layer including the above inorganic insulating materials.

In an embodiment, the storage capacitor Cst may include the lower electrode CE1 and the upper electrode CE2 overlapping each other. In an embodiment, the lower electrode CE1 of the storage capacitor Cst may include the first gate electrode G1. In other words, the first gate electrode G1 may include the lower electrode CE1 of the storage capacitor Cst. As an example, in an embodiment, the first gate electrode G1 and the lower electrode CE1 of the storage capacitor Cst may be one body.

In an embodiment, a first interlayer insulating layer 105 may be disposed between the lower electrode CE1 and the upper electrode CE2 of the storage capacitor Cst. The first interlayer insulating layer 105 may include an inorganic insulating material such as silicon nitride, silicon oxynitride, and/or silicon oxide, and may include a single-layered structure or a multi-layered structure including the above inorganic insulating materials.

In an embodiment, the upper electrode CE2 of the storage capacitor Cst may include a conductive material of a low-resistance material such as molybdenum (Mo), aluminum (Al), copper (Cu) and/or titanium (Ti), and may have a single-layered structure or a multi-layered structure including the above materials.

In an embodiment, a second interlayer insulating layer 107 may be disposed on the storage capacitor Cst. The second interlayer insulating layer 107 may include an inorganic insulating material such as silicon nitride, silicon oxynitride, and/or silicon oxide, and may include a single-layered structure or a multi-layered structure including the above inorganic insulating materials.

In an embodiment, a first source electrode S1 and/or a first drain electrode D1 may be disposed on the second interlayer insulating layer 107, the source electrode S1 and/or the drain electrode D1 may be electrically connected to the first semiconductor layer A1 of the first transistor T1. A sixth source electrode S6 and/or a sixth drain electrode D6 may be disposed on the second interlayer insulating layer 107, the source electrode S6 and/or the drain electrode D6 may be electrically connected to the sixth semiconductor layer A6 of the sixth transistor T6. In an embodiment, the source electrodes S1 and S6 and/or the drain electrodes D1 and D6 may include aluminum (Al), copper (Cu), and/or titanium (Ti), and may include a single layer or a multi-layer including the above materials.

In an embodiment, a first organic insulating layer 109 may be disposed on the sub-pixel circuit PC and may include an organic insulating material such as acryl, benzocyclobutene (BCB), polyimide, and/or hexamethyldisiloxane (HMDSO).

A connection electrode BE1 may be disposed on the first organic insulating layer 109 and may include aluminum (Al), copper (Cu), and/or titanium (Ti), and may include a single layer or a multi-layer including the above materials.

In an embodiment, a second organic insulating layer 111 may be disposed between the connection electrode BE1 and a sub-pixel electrode 210. The second organic insulating layer 111 may include an organic insulating material such as acryl, benzocyclobutene (BCB), polyimide, and/or hexamethyldisiloxane (HMDSO). According to an embodiment described with reference to FIG. 3A, although the sub-pixel circuit PC may be electrically connected to the sub-pixel electrode 210 through the connection electrode BE1, the connection electrode BE1 may be omitted and one organic insulating layer may be located between the sub-pixel circuit PC and the sub-pixel electrode 210 according to another embodiment. In addition, in an embodiment, three or more organic insulating layers may be located between the sub-pixel circuit PC and the sub-pixel electrode 210, and the sub-pixel circuit PC may be electrically connected to the sub-pixel electrode 210 through a plurality of connection metals.

In an embodiment, the sub-pixel electrode 210 may be formed on the second organic insulating layer 111. The sub-pixel electrode 210 may be formed to be a (semi) transparent electrode or formed to be a reflective electrode. In an embodiment, where the sub-pixel electrode 210 is formed to be a (semi) transparent electrode, the sub-pixel electrode 210 may include indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, where the sub-pixel electrode 210 is formed to be a reflective electrode, the sub-pixel electrode 210 may include a reflective layer including Ag, Mg, Al, Pt, Pd, Au, Ni, Nd, Ir, Cr, and/or a compound thereof, and/or a layer on the reflective layer, the layer including ITO, IZO, ZnO and/or $In_2O_3$. In an embodiment, the sub-pixel electrode 210 may have a structure of an ITO layer, an Ag layer, and/or an ITO layer that may be sequentially stacked. In an embodiment, the sub-pixel electrode 210 may be electrically connected to the connection electrode BE1 through a via hole of the second organic insulating layer 111.

In an embodiment, a conductive protective layer 113 may be formed on the sub-pixel electrode 210. The conductive protective layer 113 may be formed together with the sub-pixel electrode 210. As an example, in an embodiment, the sub-pixel electrode 210 and the conductive protective layer 113 may be formed by using the same mask. In an embodiment, the conductive protective layer 113 may prevent the sub-pixel electrode 210 from being damaged by a gas, a liquid material, or the like used in various etching processes or ashing processes included in the process of manufacturing the display apparatus. In an embodiment, the conductive protective layer 113 may include a conductive oxide such as indium tin oxide (ITO), indium zinc oxide (IZO), indium gallium zinc oxide (IGZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and/or fluorine doped tin oxide (FTO).

Referring to FIG. 3B, an inorganic bank layer 115 may be formed on the structure shown in FIG. 3A. The inorganic bank layer 115 may be formed on the substrate 100 entirely. As an example, in an embodiment, the inorganic bank layer 115 may overlap the sub-pixel electrode 210 and the conductive protective layer 113 and directly contact the upper surface of the second organic insulating layer 111 where the sub-pixel electrode 210 and the conductive protective layer 113 are not present. The inorganic bank layer 115 may cover the lateral surface of each of the sub-pixel electrode 210 and/or the conductive protective layer 113. In an embodiment, the inorganic bank layer 115 may include an inorganic insulating material. In an embodiment, where the inorganic bank layer 115 includes an inorganic insulating material, the quality of the light-emitting diode may be prevented or reduced from being deteriorated by a gas emitted from an insulating layer, which may be an organic insulating material, during the process of manufacturing the display apparatus compared to the case where the inorganic bank layer 115 may include an organic insulating material.

In an embodiment, the inorganic bank layer 115 may include an inorganic insulating material such as silicon nitride, silicon oxynitride, and/or silicon oxide, and may include a single-layered structure or a multi-layered structure including the above inorganic insulating materials. In an embodiment, the inorganic bank layer 115 may have a two-layered structure of a silicon oxide layer and a silicon nitride layer. In an embodiment, the thickness of the silicon oxide layer may be less than the thickness of the silicon nitride layer. In an embodiment, the thickness of the inorganic bank layer 115 may be greater than the thickness of the conductive protective layer 113. As an example, in an embodiment, though the thickness of the inorganic bank layer 115 may be about 1000 Å, and the thickness of the conductive protective layer 113 may be about 500 Å, the embodiment is not limited thereto.

Referring to FIG. 3C, a metal bank layer 300 may be formed on the inorganic bank layer 115 shown in FIG. 3B. In an embodiment, the metal bank layer 300 may include a first metal layer 310 and a second metal layer 320 on the first metal layer 310.

In an embodiment, the first metal layer 310 and the second metal layer 320 may include different metals. As an example, in an embodiment, the first metal layer 310 and the second metal layer 320 may include metals with a different etching selectivity. In an embodiment, the first metal layer 310 may include a layer including aluminum (Al), and/or the second metal layer 320 may include a layer including titanium (Ti).

In an embodiment, the thickness of the first metal layer 310 may be greater than the thickness of the second metal layer 320. In an embodiment, the thickness of the first metal layer 310 may be greater than about 5 times the thickness of the second metal layer 320. In another embodiment, the thickness of the first metal layer 310 may be greater than about 6 times, greater than about 7 times, or greater than about 8 times the thickness of the second metal layer 320. In an embodiment, the thickness of the first metal layer 310 may be about 4000 Å to about 8000 Å, and the thickness of the second metal layer 320 may be about 500 Å to about 800 Å. In an embodiment, the thickness of the first metal layer 310 may be about 4 times or more, about 5 times or more, or about 6 times or more of the thickness of the inorganic bank layer 115.

In an embodiment, referring to FIG. 3D, a photoresist PR may be formed on the metal bank layer 300. The photoresist PR may include an opening overlapping the sub-pixel electrode 210 and/or the conductive protective layer 113. A portion of the upper surface of the metal bank layer 300 may be exposed through the opening of the photoresist PR.

In an embodiment, referring to FIG. 3E, a portion of the metal bank layer 300, for example, a portion of the second metal layer 320 and a portion of the first metal layer 310 may be removed using the photoresist PR as a mask. As an example, in an embodiment, a portion of the second metal layer 320 and a portion of the first metal layer 310 may be sequentially removed through the opening of the photoresist PR. In an embodiment, a portion of the second metal layer 320 and a portion of the first metal layer 310 may be removed by dry etching. During the etching process, the inorganic bank layer 115 and the conductive protective layer 113 may protect the sub-pixel electrode 210 thereunder.

In an embodiment, by the etching process, an opening 320OP1 may be formed in the second metal layer 320, wherein the opening 320OP1 may overlap the sub-pixel electrode 210 and/or the conductive protective layer 113 and may pass through the bottom surface from the upper surface of the second metal layer 320. In an embodiment, an opening 310OP1 may be formed in the first metal layer 310, wherein the opening 310OP1 may overlap the sub-pixel electrode 210 and/or the conductive protective layer 113 and may pass through the bottom surface from the upper surface of the first metal layer 310.

In an embodiment, referring to FIG. 3F, an opening having an undercut shape may be formed in the metal bank layer 300 by using the photoresist PR as a mask.

As an example, in an embodiment, a portion of the first metal layer 310 may be further etched by using the photoresist PR as a mask, and an opening 310OP2 may be formed in the first metal layer 310, wherein the opening 310OP2 has a width greater than the width of the opening 310OP1 of the first metal layer 310 formed in the process of FIG. 3E. In an embodiment, the opening 310OP2 of the first metal layer 310 may have a shape reducing toward the lower portion. As an example, in an embodiment, the width of the upper portion of the opening 310OP2 of the first metal layer 310 may be greater than the width of the lower portion. In other words, the lateral surface of the first metal layer 310 facing the opening 310OP2 may include a slope surface tapered forward.

In an embodiment, the opening OP having an undercut shape may be formed in the metal bank layer 300 through wet etching. As an example, in an embodiment, the opening 310OP2 of the first metal layer 310 may be formed through wet etching. In an embodiment, because the first metal layer 310 and the second metal layer 320 may include metals having a different etching selectivity, a portion of the first metal layer 310 may be removed during the wet etching process, and the opening 310OP2 of the first metal layer 310 which may have a width greater than the width of the opening 320OP1 of the second metal layer 320 may be formed. In an embodiment, during the etching process of forming the opening 310OP2 of the first metal layer 310, the inorganic bank layer 115 and the conductive protective layer 113 may be configured to protect the sub-pixel electrode 210 thereunder.

In an embodiment, because the opening 310OP2 of the first metal layer 310 may have a large diameter while overlapping the opening 320OP1 of the second metal layer 320, the second metal layer 320 may have a first tip PT1.

In an embodiment, a portion of the second metal layer 320 defining the opening 320OP1 of the second metal layer 320 may protrude to the opening 320OP1 from a point CP at which the lateral surface of the first metal layer 310 facing the opening 310OP2 of the first metal layer 310 meets the bottom surface of the second metal layer 320 and may form an undercut structure. In an embodiment, a portion of the second metal layer 320 further protruding to the opening 320OP1 may correspond to the first tip PT1. In an embodiment, the length of the first tip PT1, for example, a length "a" from the point CP to the edge (or the lateral surface) of the first tip PT1 may be about 2 μm or less. In an embodiment, the length of the first tip PT1 of the second metal layer 320 may be about 0.3 μm to about 1 μm or about 0.3 μm to about 0.7 μm.

In an embodiment, a tapered slope angle of the lateral surface of the first metal layer 310 (e.g., a slope angle of the lateral surface of the first metal layer 310 with respect to a virtual line IML parallel to the upper surface of the substrate 100) facing the opening 310OP2 of the first metal layer 310 may be equal to or greater than about 60° and less than about 90°.

In an embodiment, referring to FIG. 3G, a portion of the inorganic bank layer 115 may be removed using the photoresist PR as a mask. In an embodiment, a portion of the inorganic bank layer 115 may be removed by dry etching. In an embodiment, the width of the opening 115OP1 of the inorganic bank layer 115 may be substantially the same as the width of the opening area of the photoresist PR and/or the width of the upper side of the opening OP of the bank layer 300 (e.g., the width of the opening 320OP1 of the second metal layer 320).

As an example, in an embodiment, the width of the opening 115OP1 of the inorganic bank layer 115 may be less than the width of the lower portion of the first metal layer 310. The lower portion (e.g., a point at which the lateral surface of the first metal layer 310 meets the bottom surface) of the lateral surface of the first metal layer 310 may meet the upper surface of the inorganic bank layer 115.

In an embodiment, referring to FIG. 3H, a portion of the conductive protective layer 113 may be removed using the photoresist PR as a mask. In an embodiment, a portion of the conductive protective layer 113 may be removed using wet etching, and the sub-pixel electrode 210 may be exposed through the opening 113OP1 of the conductive protective layer 113. The width of the opening 113OP1 of the conductive protective layer 113 while a portion of the conductive protective layer 113 may be removed may be greater than the width of the opening 115OP1 of the insulating layer 115. In other words, the edge (or the lateral surface) of the conductive protective layer 113 defining the opening 113OP1 of the conductive protective layer 113 may be located under the inorganic bank layer 115.

Then, in an embodiment, the photoresist PR may be removed.

In an embodiment, referring to FIG. 3I, an intermediate layer 220 and an opposite electrode 230 may be formed on the structure of FIG. 3H from which the photoresist PR is removed, to overlap the sub-pixel electrode 210. In an embodiment, a stack structure of the sub-pixel electrode 210, the intermediate layer 220, and/or the opposite electrode 230 may correspond to the light-emitting diode ED. In an embodiment, the intermediate layer 220 and/or the opposite electrode 230 may be formed by deposition methods such as thermal deposition.

In an embodiment, the intermediate layer 220 may include an emission layer 222 as shown in FIG. 3I. The intermediate layer 220 may include a common layer disposed between the sub-pixel electrode 210 and the emission layer 222 and/or between the emission layer 222 and the opposite electrode 230. Hereinafter, a common layer disposed between the sub-pixel electrode 210 and the emission layer 222 may be referred to as a first common layer 221, and a common layer the emission layer 222 and the opposite electrode 230 may be referred to as a second common layer 223.

In an embodiment, the emission layer 222 may include a polymer organic material and/or a low-molecular weight organic material emitting light having a preset color (red, green, or blue). In another embodiment, the emission layer 222 may include an inorganic material or quantum dots.

In an embodiment, the first common layer 221 may include a hole transport layer (HTL) and/or a hole injection layer (HIL). The second common layer 223 may include an electron transport layer (ETL) and/or an electron injection layer (EIL). In an embodiment, the first common layer 221 and/or the second common layer 223 may include an organic material.

In an embodiment, the intermediate layer 220 may have a single stack structure including a single emission layer, and/or a tandem structure, which may be a multi-stack structure including a plurality of emission layers. In an embodiment, where the intermediate layer 220 has a tandem structure, a charge generation layer CGL may be disposed between the plurality of stacks.

In an embodiment, the opposite electrode 230 may include a conductive material having a low work function. As an example, in an embodiment, the opposite electrode 230 may include a (semi) transparent layer including silver (Ag), magnesium (Mg), aluminum (Al), platinum (Pt), palladium (Pd), gold (Au), nickel (Ni), neodymium (Nd), and/or iridium (Ir), chromium (Cr), lithium (Li), calcium (Ca), and/or an alloy thereof. Alternatively, in an embodiment, the opposite electrode 230 may further include a layer on the (semi) transparent layer, the layer including ITO, IZO, ZnO, or $In_2O_3$.

In an embodiment, and referring to FIG. 3I again, the intermediate layer 220 may overlap and contact the sub-pixel electrode 210 through the opening OP of the metal bank layer 300, the opening 115OP1 of the inorganic bank layer 115, and/or the opening 113OP1 of the conductive protective layer 113. The width of the emission area of the light-emitting diode ED may be substantially the same as the width of the opening 115OP1 of the inorganic bank layer 115.

In an embodiment, because the intermediate layer 220 and the opposite electrode 230 may be deposited without a separate mask, a deposition material for forming the intermediate layer 220 and/or a deposition material for forming the opposite electrode 230 may form a dummy intermediate layer 220*b* and/or a dummy opposite electrode 230*b* on the metal bank layer 300. The intermediate layer 220 may be separated and apart from the dummy intermediate layer 220*b*, and/or the opposite electrode 230 may be separated and apart from the dummy opposite electrode 230*b*. In an embodiment, the intermediate layer 220 and/or the dummy intermediate layer 220*b* may include the same material and/or the same number of sub-layers (e.g., a first common layer, an emission layer, and a second common layer). In an embodiment, the opposite electrode 230 and/or the dummy opposite electrode 230*b* may include the same material. However, in an embodiment, the dummy intermediate layer 220*b* and the dummy opposite electrode 230*b* may be disposed not only on the second metal layer 230 but also may cover the lateral surface of the second metal layer 230. FIG. 3J is an enlarged view of a region A of FIG. 3I. In an embodiment, as in FIG. 3J, the outer portion of the dummy intermediate layer 220*b* may extend to cover the lateral surface of the second metal layer 320 facing the opening OP. In addition, In an embodiment, the outer portion of the dummy opposite electrode 230*b* may be disposed on the dummy intermediate layer 220*b* and may extend to overlap the lateral surface of the second metal layer 320 facing the opening OP.

In an embodiment, the edge or outer portion (or neighboring portion) of the opposite electrode 230 may extend beyond the edge or outer portion (or neighboring portion) of the intermediate layer 220 and may directly contact the lateral surface of the first metal layer 310. In an embodiment, the first metal layer 310 may be electrically connected to the opposite electrode 230. In the specification, the "outer portion (or neighboring portion)" of the opposite electrode 230 denotes a "portion of the opposite electrode 230 including the edge of the opposite electrode 230".

In an embodiment, the outer portions of the intermediate layer 220, the dummy intermediate layer 220*b*, the opposite electrode 230, and/or the dummy opposite electrode 230*b* may respectively have thinner thicknesses than the central portions thereof. Specifically, in an embodiment, a thickness T1' of the outer portion of the intermediate layer 220 directly contacting the lateral surface of the first metal layer 310 may be equal to or less than a half of a thickness T1 of the central portion of the intermediate layer 220 directly contacting the upper surface of the sub-pixel electrode 210. In an embodiment, a thickness T2' of the outer portion of the dummy intermediate layer 220*b* directly contacting the lateral surface of the second metal layer 320 may be equal to or less than a half of a thickness T2 of the central portion of the dummy intermediate layer 220*b* directly contacting the upper surface of the second metal layer 320. Likewise, In an embodiment, a thickness T3' of the outer portion of the opposite electrode 230 directly contacting the lateral surface of the first metal layer 310 may be equal to or less than a half of a thickness T3 of the central portion of the opposite electrode 230. In an embodiment, a thickness T4' of the outer portion of the dummy opposite electrode 230*b* overlapping the lateral surface of the second metal layer 320 may be equal to or less than a half of a thickness T4 of the central portion of the dummy opposite electrode 230*b*.

In an embodiment, referring to FIG. 3K, a capping layer 400 and/or an encapsulation layer 500 may be formed on the light-emitting diode ED.

In an embodiment, the capping layer 400 may improve an external light-emission efficiency of the light-emitting diode ED based on a constructive interference principle. In an embodiment, the capping layer 400 may be an organic capping layer including an organic material, an inorganic capping layer including an inorganic material, and/or a composite capping layer including an organic material and/or an inorganic material. In an embodiment, the capping layer 400 may be disposed between the opposite electrode 230 and a first inorganic encapsulation layer 510 described below and between the dummy opposite electrode 230*b* and the first inorganic encapsulation layer 510. In an embodiment, like the dummy intermediate layer 220*b* and the dummy opposite electrode 230*b* of FIG. 3J described above, a portion of the capping layer 400 disposed on the metal bank layer 300 may extend to overlap the lateral surface of the second metal layer 320. In an embodiment, the capping layer 400 may be omitted.

In an embodiment, the encapsulation layer 500 may include at least one inorganic encapsulation layer and/or at least one organic encapsulation layer. In an embodiment, it is shown in FIG. 3K that the encapsulation layer 500 may include the first inorganic encapsulation layer 510, an organic encapsulation layer 520 on the first inorganic encapsulation layer 510, and/or a second inorganic encapsulation layer 530 on the organic encapsulation layer 520.

In an embodiment, the first inorganic encapsulation layer 510 and/or the second inorganic encapsulation layer 530 may include at least one inorganic material from among aluminum oxide, titanium oxide, tantalum oxide, hafnium oxide, zinc oxide, silicon oxide, silicon nitride, and/or silicon oxynitride and may be deposited using chemical vapor deposition. In an embodiment, the first and second inorganic encapsulation layer 510 and 530, respectively, may include a single layer and/or a multi-layer including the above materials. In an embodiment, the organic encapsulation layer 520 may include a polymer-based material. In an embodiment, the polymer-based material may include an acryl-based resin, an epoxy-based resin, polyimide, and/or polyethylene. In an embodiment, the organic encapsulation layer 520 may include acrylate.

In an embodiment, the first inorganic encapsulation layer 510 having a relatively excellent step coverage may cover at least a portion of the inner surface of the opening OP of the metal bank layer 300 having an undercut structure. In an embodiment, the first inorganic encapsulation layer 510 may be formed to continuously overlap (or cover) the upper surface and the lateral surface of the dummy opposite electrode 230*b*, the lateral surface of the dummy intermediate layer 220*b*, the lateral surface and the bottom surface of the second metal layer 320, the lateral surface of the first metal layer 310, and/or the upper surface of the opposite electrode 230.

In an embodiment, the organic encapsulation layer 520 may be located on the first inorganic encapsulation layer 510 and may fill at least a portion of the opening OP of the metal bank layer 300. The second inorganic encapsulation layer 530 may be disposed on the organic encapsulation layer 520.

In an embodiment shown in FIGS. 3A to 3K, though the metal bank layer 300 includes the first metal layer 310 and the second metal layer 320 on the first metal layer 310, the embodiment is not limited thereto. In another embodiment, the metal bank layer 300 may include the first metal layer 310, the second metal layer 320 on the first metal layer 310, and/or a third metal layer under the first metal layer 310. The third metal layer may include a material which may be the same as or different from a material of the first metal layer 310.

Referring to FIG. 3M, the display apparatus according to another embodiment may further include an insulating protective layer 117, and/or the structure of the opening OP may be different.

Specifically, in an embodiment, the insulating protective layer 117 may be disposed between the metal bank layer 300 and the inorganic bank layer 115. In an embodiment, the insulating protective layer 117 may prevent the sub-pixel electrode 210 from being damaged by a gas, a liquid material, or the like used in various processes (e.g., etching or ashing process) included in the process of manufacturing the display apparatus 1.

In an embodiment, the insulating protective layer 117 may include an amorphous inorganic insulating material such as silicon oxide and/or silicon nitride. In an embodiment, the insulating protective layer 117 may include a material having an etching selectivity different from those of the conductive protective layer 113, the inorganic bank layer 115, and/or the metal bank layer 300 among the inorganic insulating materials. In an embodiment, the insulating protective layer 117 may have a molecular structure different from that of the conductive protective layer 113 and/or may have a chemical resistance different from that of the conductive protective layer 113. In an embodiment, the insulating protective layer 117 may prevent etchant from damaging the sub-pixel electrode 210 by passing through a crystal structure of the conductive protective layer 113 (e.g., a pinhole in the conductive protective layer) in an etching process (e.g., wet etching) for forming an undercut structure (or an overhang structure) of the metal bank layer 300 of the process of manufacturing the display apparatus 1.

In addition, referring to FIG. 3M, in an embodiment, the opening 113OP1 of the conductive protective layer 113, the opening 115OP1 of the inorganic bank layer 115, the opening 117OP1 of the insulating protective layer 117, the opening 310OP1 of the first metal layer 310, and/or the opening 320OP1 of the second metal layer 320 may overlap each other.

In an embodiment, as in FIG. 3H, the width of the opening 113OP1 of the conductive protective layer 113 may be greater than a width W1 of the opening 115OP1 of the inorganic bank layer 115. In other words, the edge (or the lateral surface) of the conductive protective layer 113 defining the opening 113OP1 of the conductive protective layer 113 may be located under the inorganic bank layer 115.

However, unlike FIG. 3H, in an embodiment, the width W1 of the opening 115OP1 of the inorganic bank layer 115 may be less than the width of the opening OP of the metal bank layer 300. Specifically, the width W1 of the opening 115OP1 of the inorganic bank layer 115 may be less than a width W3 of the opening 320OP1 of the second metal layer 320. In addition, in an embodiment, a width W2 of the opening 117OP1 of the insulating protective layer 117 may be greater than the opening 320OP1 of the second metal layer 320. Accordingly, in an embodiment, the width W1 of the opening 115OP1 of the inorganic bank layer 115 may be less than the width W2 of the opening 117OP1 of the insulating protective layer 117. As an example, in an embodiment, the lower portion (e.g., a point at which the lateral surface of the insulating protective layer 117 meets the bottom surface of the insulating protective layer 117) of the insulating protective layer 117 may meet the upper surface of the inorganic bank layer 115.

In an embodiment, the intermediate layer 220 (see FIG. 3K) and/or the opposite electrode 230 (see FIG. 3K) may be disposed in the opening OP of the metal bank layer 300, the opening 117OP1 of the insulating protective layer 117, the opening 115OP1 of the inorganic bank layer 115, and/or the opening 113OP1 of the conductive protective layer 113.

Figure 4A:
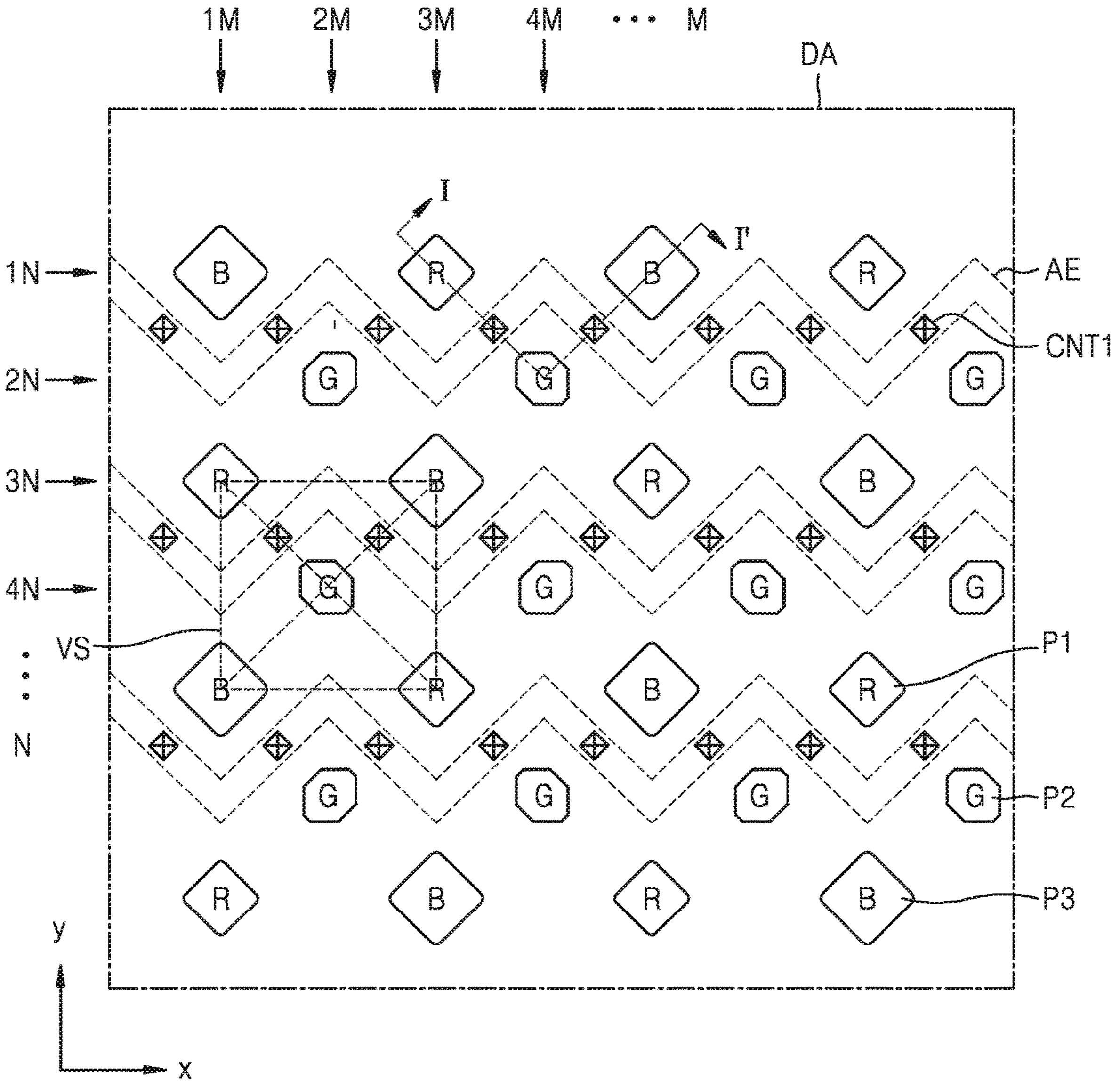
FIG. 4A is a schematic plan view of a display apparatus according to an embodiment.
Figure 4B:
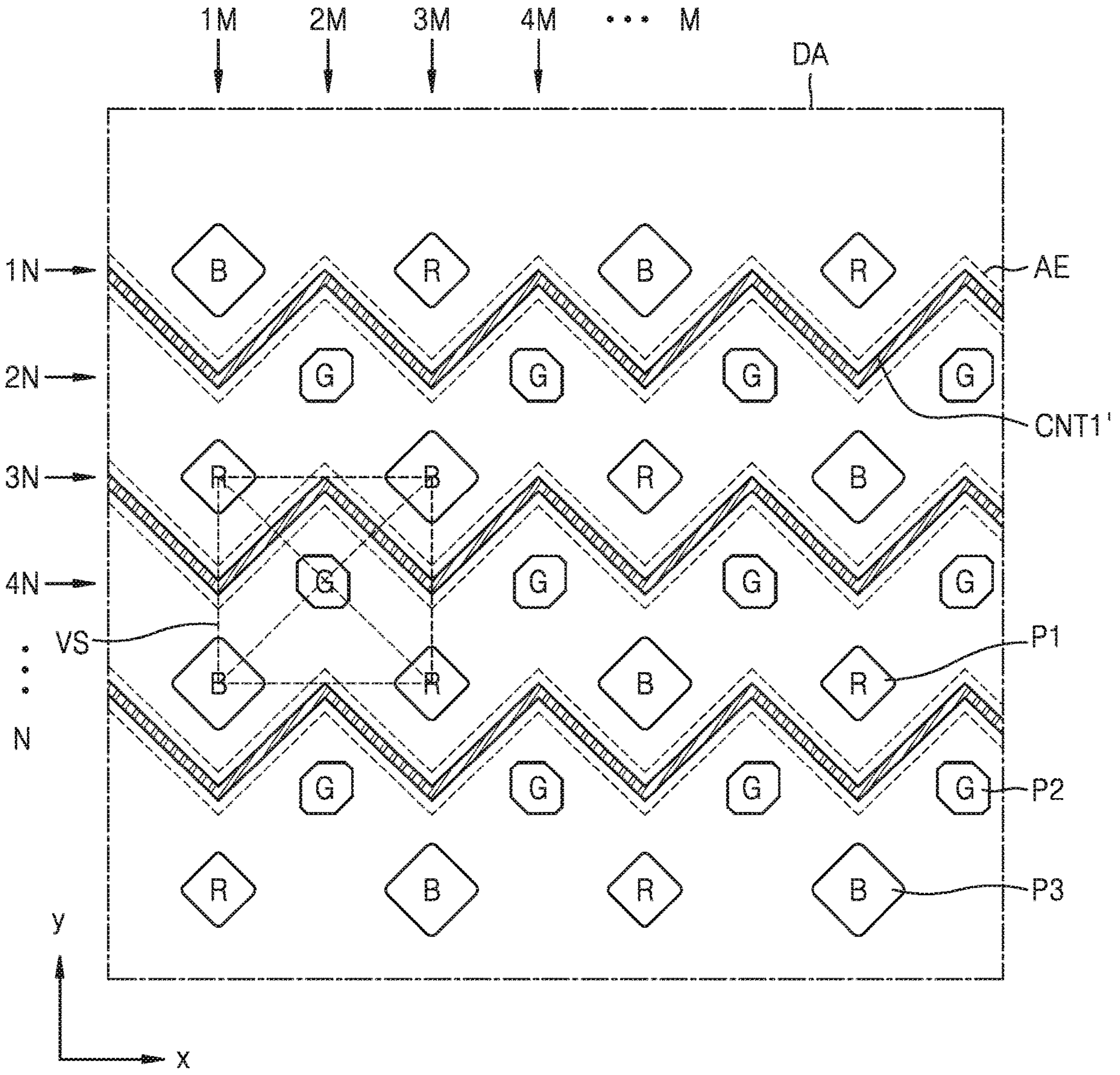
FIG. 4B is a schematic plan view of a display apparatus according to another embodiment.

FIG. 4A is a schematic plan view of the display apparatus according to an embodiment, and FIG. 4B is a schematic plan view of a display apparatus according to another embodiment.

Referring to FIGS. 4A and 4B, in an embodiment, a plurality of sub-pixels may be arranged in the display area DA of the display apparatus. A region in which the plurality of sub-pixels are arranged may be referred to as a sub-pixel area. In the specification, a sub-pixel may be a minimum unit that may implement an image and that may denote an emission area. In an embodiment, where an organic light-emitting diode is employed as a display element, the emission area may be defined by the opening of the bank layer.

As shown in FIG. 4A, in an embodiment, the sub-pixels arranged in the display area DA may be arranged in a pentile structure. A first sub-pixel P1, a second sub-pixel P2, and a third sub-pixel P3 may be respectively configured to implement red, green, and blue colors.

In an embodiment, a plurality of first sub-pixels P1 and a plurality of third sub-pixels P3 may be alternately arranged in a first row 1N, a plurality of second sub-pixels P2 may be arranged to be apart at a preset interval in an adjacent second row 2N, and a plurality of third sub-pixels P3 and a plurality of first sub-pixels P1 may be alternately arranged in an adjacent third row 3N, and a plurality of second sub-pixels P2 may be arranged to be apart at a preset interval on an adjacent fourth row 4N. Such a sub-pixel arrangement may be repeated to an N-th row. In an embodiment, the third sub-pixel P3 and the first sub-pixel P1 may be greater than the second sub-pixel P2.

In an embodiment, the plurality of first sub-pixels P1 and the plurality of third sub-pixels P3 in the first row 1N, and the plurality of second sub-pixels P2 in the second row 2N may be alternately arranged with each other. A plurality of first sub-pixels P1 and a plurality of third sub-pixels P3 may be alternately arranged in a first column 1M, a plurality of second sub-pixels P2 may be arranged to be apart at a preset interval in an adjacent second column 2M, and a plurality of third sub-pixels P3 and a plurality of first sub-pixels P1 may be alternately arranged in an adjacent third column 3M, and a plurality of second sub-pixels P2 may be arranged to be apart at a preset interval on an adjacent fourth column 4M. Such a sub-pixel arrangement may be repeated to an M-th column.

In an embodiment, such sub-pixel arrangement structure may be expressed differently, in which: first sub-pixels P1 may be respectively arranged on first and third vertexes facing each other among the vertexes of a virtual quadrangle VS with a second sub-pixel P2 centered at the center of the quadrangle, and third sub-pixels P3 may be respectively arranged on second and fourth vertexes, which are the rest of the vertexes. In an embodiment, the virtual quadrangle VS may be variously changed to a rectangle, a rhombus, a square, and/or the like.

In an embodiment, this sub-pixel arrangement structure is referred to as a pentile matrix structure or a pentile structure. By applying rendering, in which a color of a sub-pixel may be represented by sharing the colors of its adjacent sub-pixels, a high resolution may be obtained via a small number of pixels.

Although FIGS. 4A and 4B show that a plurality of main sub-pixels may be arranged in a pentile matrix configuration, the embodiment is not limited thereto. As an example, in an embodiment, the plurality of main sub-pixels may be arranged in various configurations such as a stripe configuration, a mosaic configuration, a delta configuration and/or the like.

In addition, an auxiliary electrode AE may be arranged in the display area DA. In an embodiment, the auxiliary electrode AE may be arranged in a region (referred to as a non-sub-pixel area, hereinafter) in which the first to third sub-pixels P1, P2, and P3, respectively, may not be arranged. In an embodiment, the auxiliary electrode AE may be a wiring configured to apply the common voltage ELVSS (see FIG. 2A), that is, the auxiliary line VSL (see FIG. 2A). However, the embodiment is not limited thereto and, in an embodiment, the auxiliary electrode AE may be a signal line such as the data line DL (see FIG. 2A). Alternatively, in an embodiment, the auxiliary electrode AE may be disposed on substantially the same layer as a layer on which the auxiliary line VSL and/or the data line DL are disposed and may be a portion of a metal layer including the same material.

In an embodiment, the auxiliary electrode AE may extend in a first direction (e.g., an x direction) in the non-sub-pixel area and may be arranged to be apart from each other in a second direction (e.g., a y direction) crossing the first direction. In an embodiment, the auxiliary electrodes AE may be apart from each other, and light-emitting diodes, for example, organic light-emitting diodes may be arranged between two adjacent auxiliary electrodes AE. In an embodiment, it is shown in FIGS. 4A and 4B that the first sub-pixel P1, the second sub-pixel P2, and the third sub-pixel P3 may be arranged between two adjacent auxiliary electrodes AE.

In an embodiment, the auxiliary electrode AE may be arranged to extend in the first direction and may extend to cross a non-sub-pixel area between the second sub-pixel P2 and the first sub-pixel P1 and a non-sub-pixel area between the second sub-pixel P2 and the third sub-pixel P3. In an embodiment, because the second sub-pixel P2 is alternately arranged with the first sub-pixel P1 and the third sub-pixel P3 in different rows, the auxiliary electrode AE may be arranged in a zigzag pattern in the non-sub-pixel area in a plan view. Specifically, in an embodiment, a first portion of the auxiliary electrode AE may extend in a direction tilted at about 45° from the first direction to cross the non-sub-pixel area between the third sub-pixel P3 in the first row 1N and the second sub-pixel P2 in the second row 2N. In an embodiment, a second portion of the auxiliary electrode AE may extend in a direction tilted at about 45° from the first direction to cross the non-sub-pixel area between the second sub-pixel P2 in the second row 2N and the first sub-pixel P1 in the first row 1N. In an embodiment, the first portion and the second portion of the auxiliary electrode AE may respectively extend in directions perpendicular to each other. In an embodiment, the first portion and/or the second portion of the auxiliary electrode AE may be repeatedly arranged in the non-sub-pixel area between the plurality of sub-pixels in the first row 1N and the second row 2N. In an embodiment, the auxiliary electrodes AE having a zigzag pattern may also be arranged in the non-sub-pixel area between the plurality of sub-pixels in the third row 3N and the fourth row 4N, and the auxiliary electrodes AE may be arranged to be apart from each other. The structure shown in FIG. 4A shows a portion of the display area DA. The display area DA may be a region in which the structure of FIG. 4A is repeated.

In an embodiment, the auxiliary electrode AE may contact the inorganic bank layer 115 (see FIG. 3K) arranged in the non-sub-pixel area. In an embodiment, for the auxiliary electrode AE to contact the inorganic bank layer 115 (see FIG. 3K), the upper layer of the auxiliary electrode AE may include a first contact hole CNT1 exposing a portion of the auxiliary electrode AE. In an embodiment, because the first contact hole CNT1 exposes a portion of the auxiliary electrode AE and may contact the inorganic bank layer 115 (see FIG. 3K), the first contact hole CNT1 may overlap the pattern in which the auxiliary electrode AE is arranged. That is, the first contact hole CNT1 may be formed in the pattern in which the auxiliary electrode AE is arranged, wherein the first contact hole CNT1 may pass through the second organic insulating layer 111 (see FIG. 3K).

Specifically, referring to FIG. 4A, in an embodiment, the first contact hole CNT1 may be formed in a form of drilling a hole only in a partial area of the pattern in which the auxiliary electrode AE may be arranged. That is, a plurality of first contact holes CNT1 may be formed in the second organic insulating layer 111 (see FIG. 3K) disposed on the auxiliary electrode AE having a zigzag shape in a plan view. In an embodiment, a hole formed by the first contact hole CNT1 may be circular but is not limited thereto and may be a polygonal shape such as quadrangles. In addition, as shown in FIG. 4A, In an embodiment, the first contact hole CNT1 may be formed in the central portion of the non-sub-pixel area between the third sub-pixel P3 and the second sub-pixel P2 and/or the central portion of the non-sub-pixel area between the first sub-pixel P1 and the second sub-pixel P2. However, the embodiment is not limited thereto and, in an embodiment, the first contact hole CNT1 may be formed in any area as long as it overlaps the zigzag pattern of the auxiliary electrode AE.

In another embodiment, referring to FIG. 4B, first contact holes CNT1' may be arranged in a straight line shape, in a plan view, along the pattern in which the auxiliary electrodes AE are arranged. That is, the first contact holes CNT1' may be equally formed in a zigzag pattern along the pattern in which the auxiliary electrodes AE are arranged. Like the auxiliary electrode AE, In an embodiment, the first contact hole CNT1' may extend in the first direction (e.g., the x direction) in the non-sub-pixel area of the display area DA in which the first to third sub-pixels P1, P2, and P3, respectively, are not arranged.

Figure 5:
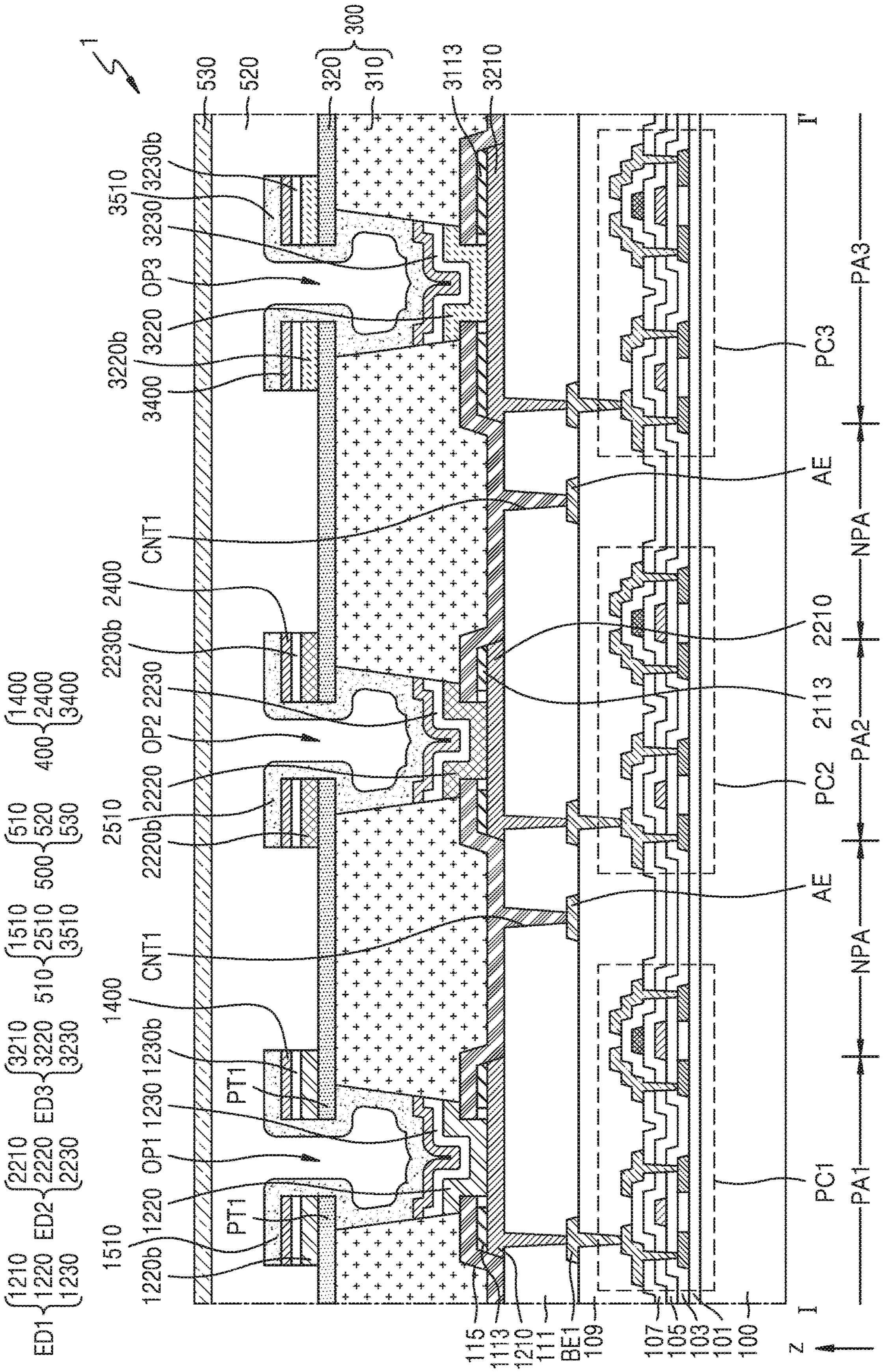
FIG. 5 is a schematic cross-sectional view of the display apparatus of FIG. 4A, taken along line I-I' in FIG. 4A.

FIG. 5 is a schematic cross-sectional view of an embodiment of the display apparatus, taken along line I-I' of FIG. 4A.

Referring to FIG. 5, an embodiment of the display apparatus 1 may include first to third sub-pixel areas PA1, PA2, and PA3, respectively, and may include a non-sub-pixel area NPA between the adjacent sub-pixel areas. In an embodiment, the planar shape of the display apparatus 1 may be actually the same as a planar shape of the substrate 100. Accordingly, when the display apparatus 1 includes the first to third sub-pixel areas PA1, PA2, and PA3, respectively, and the non-sub-pixel area NPA, it may represent that the substrate 100 includes the first to third sub-pixel areas PA1, PA2, and PA3, respectively, and the non-sub-pixel area NPA.

In an embodiment, first to third light-emitting diodes ED1, ED2, and ED3, respectively, may be disposed over the substrate 100. In an embodiment, the first to third light-emitting diodes ED1, ED2, and ED3, respectively, may be respectively arranged in the first to third sub-pixel areas PA1, PA2, and PA3, respectively.

In an embodiment, first to third sub-pixel circuits PC1, PC2, and PC3, respectively, may be disposed between the substrate 100 and the first to third light-emitting diodes ED1, ED2, and ED3, respectively. In an embodiment, the first to third sub-pixel circuits PC1, PC2, and PC3, respectively, may each include the transistor and/or the storage capacitor described above with reference to FIG. 2A or 2B. In an embodiment, it is shown in FIG. 5 that the first to third sub-pixel circuits PC1, PC2, and PC3, respectively, may each have the same structure as the structure of the sub-pixel circuit PC (see FIG. 3A) described with reference to FIG. 3, and/or a specific structure may be the same as that described above.

In an embodiment, the first organic insulating layer 109 and/or the second organic insulating layer 111 may be disposed on the first to third sub-pixel circuits PC1, PC2, and PC3, respectively. In an embodiment, the connection electrodes BE1 may be disposed between the first organic insulating layer 109 and the second organic insulating layer 111, wherein the connection electrodes BE1 may respectively connect the first to third sub-pixel circuits PC1, PC2, and PC3, respectively, to the first to third light-emitting diodes ED1, ED2, and ED3, respectively. Accordingly, in an embodiment, the connection electrodes BE1 may be respectively connected to the first to third sub-pixel circuits PC1, PC2, and PC3, respectively, through via holes of the first organic insulating layer 109 and respectively may be connected to the first to third light-emitting diodes ED1, ED2, and ED3, respectively, through via holes in the second organic insulating layer 111. In an embodiment, the connection electrode BE1 may include aluminum (Al), copper (Cu), and/or titanium (Ti), and may include a single layer and/or a multi-layer including the above materials.

In an embodiment, the auxiliary electrode AE may be disposed between the first organic insulating layer 109 and the second organic insulating layer 111. That is, the auxiliary electrode AE may be disposed on the same layer as a layer on which the connection electrode BE1 is disposed and may include the same material as a material of the connection electrode BE1. As described above, in an embodiment, the auxiliary electrode AE may be the auxiliary line VSL (see FIG. 2A) or the data line DL (see FIG. 2A). However, the embodiment is not limited thereto and the auxiliary electrode AE may be a partial area of the metal layer disposed between the first organic insulating layer 109 and the second organic insulating layer 111. The auxiliary electrode AE may include aluminum (Al), copper (Cu), and/or titanium (Ti), and include a single layer and/or a multi-layer including the above materials.

In an embodiment, the first to third light-emitting diodes ED1, ED2, and ED3, respectively, may be electrically connected to the first to third sub-pixel circuits PC1, PC2, and PC3, respectively, and may each have a stack structure of the sub-pixel electrode, the intermediate layer, and the opposite electrode.

As an example, in an embodiment, the first light-emitting diode ED1 may include a first sub-pixel electrode 1210, a first intermediate layer 1220, and/or a first opposite electrode 1230. The first sub-pixel electrode 1210 may be electrically connected to the first sub-pixel circuit PC1. The second light-emitting diode ED2 may include a second sub-pixel electrode 2210, a second intermediate layer 2220, and a second opposite electrode 2230. The second sub-pixel electrode 2210 may be electrically connected to the second sub-pixel circuit PC2. The third light-emitting diode ED3 may include a third sub-pixel electrode 3210, a third intermediate layer 3220, and a third opposite electrode 3230. The third sub-pixel electrode 3210 may be electrically connected to the third sub-pixel circuit PC3.

In an embodiment, the first intermediate layer 1220, the second intermediate layer 2220, and the third intermediate layer 3220 may each include the emission layer, and the first and/or second common layer as described with reference to FIG. 3I. Specific structure and material are the same as those described above. Here, the emission layer of the first intermediate layer 1220, the emission layer of the second intermediate layer 2220, and/or the emission layer of the third intermediate layer 3220 may be configured to emit light of different colors.

In an embodiment, the first sub-pixel electrode 1210, the second sub-pixel electrode 2210, and the third sub-pixel electrode 3210 may each include an inner portion and an outer portion surrounding the inner portion. In the disclosure, an "outer portion (or neighboring portion)" of the sub-pixel electrode may denote a portion of the sub-pixel electrode including the edge of the sub-pixel electrode, and an "inner portion of the sub-pixel electrode" may denote another portion of the sub-pixel area surrounded by the outer portion (or neighboring portion).

In an embodiment, the first intermediate layer 1220 may overlap and contact the inner portion of the first sub-pixel electrode 1210, and the first opposite electrode 1230 may overlap the first intermediate layer 1220. In an embodiment, the inorganic bank layer 115 may be disposed on the outer portion of the first sub-pixel electrode 1210. In an embodiment, the inorganic bank layer 115 may overlap the outer portion of the first sub-pixel electrode 1210 and extend onto the second organic insulating layer 111 to cover the lateral surface of the first sub-pixel electrode 1210. In an embodiment, a first conductive protective layer 1113 may be disposed between the inorganic bank layer 115 and the outer portion of the first sub-pixel electrode 1210. In an embodiment, the inorganic bank layer 115 and the first conductive protective layer 1113 may each be disposed on the outer portion of the first sub-pixel electrode 1210, and may not be present on the inner portion of the first sub-pixel electrode 1210. In other words, the inorganic bank layer 115 and the first conductive protective layer 1113 may each include an opening overlapping the inner portion of the first sub-pixel electrode 1210.

Similarly, In an embodiment, the second intermediate layer 2220 may overlap and contact the inner portion of the second sub-pixel electrode 2210, and the second opposite electrode 2230 may overlap the second intermediate layer 2220. In an embodiment, the outer portion of the second sub-pixel electrode 2210 may overlap the inorganic bank layer 115. In an embodiment, the third intermediate layer 3220 may overlap and contact the inner portion of the third sub-pixel electrode 3210, and the third opposite electrode 3230 may overlap the third intermediate layer 3220. In an embodiment, the outer portion of the third sub-pixel electrode 3210 may overlap the inorganic bank layer 115. In an embodiment, the inorganic bank layer 115 may overlap the outer portion of each of the second sub-pixel electrode 2210 and the third sub-pixel electrode 3210 and extend on the second organic insulating layer 111 to cover the lateral surface of each of the second sub-pixel electrode 2210 and the third sub-pixel electrode 3210. In an embodiment, a second conductive protective layer 2113 may be disposed between the inorganic bank layer 115 and the second sub-pixel electrode 2210, and a third conductive protective layer 3113 may be disposed between the inorganic bank layer 115 and the third sub-pixel electrode 3210.

Specifically, in an embodiment, the inorganic bank layer 115 may be disposed between the second organic insulating layer 111 and the metal bank layer 300. In an embodiment, the inorganic bank layer 115 may extend to cover the end of the first sub-pixel electrode 1210 and/or the end of the second sub-pixel electrode 2210. In addition, in an embodiment, the inorganic bank layer 115 may be disposed on the organic insulating layer 111 and may extend to cover the end of the first sub-pixel electrode 1210 and the end of the second sub-pixel electrode 2210.

In an embodiment, the bottom surface of the inorganic bank layer 115 may contact the auxiliary electrode AE through the first contact hole CNT1. That is, the auxiliary electrode AE may directly contact the inorganic bank layer 115 through the first contact hole CNT1 passing through the second organic insulating layer 111. As shown in FIG. 5, in an embodiment, the auxiliary electrode AE may be disposed between adjacent light-emitting diodes and/or between adjacent sub-pixel circuits. As an example, in an embodiment, the auxiliary electrode AE may be disposed between the first sub-pixel area PA1 and the second sub-pixel area PA2, between the second sub-pixel area PA2 and the third sub-pixel area PA3, and/or between the third sub-pixel area PA3 and the first sub-pixel area PA1. Accordingly, the inorganic bank layer 115 may contact the auxiliary electrode AE through the first contact hole CNT1 in the non-sub-pixel area NPA.

In the related art, there is a danger that layer-floating defects may occur between the second organic insulating layer 111 and the inorganic bank layer 115 arranged in the non-sub-pixel area NPA. In the case where layer floating occurs between the second organic insulating layer 111 and the inorganic bank layer 115, not only contaminants from the outside may flow in but it may also increase a defect rate during a subsequent processes. In contrast, according to an embodiment, as shown in FIG. 5, when the first contact hole CNT1 is formed in the second organic insulating layer 111 of the non-sub-pixel area NPA and the inorganic bank layer 115 contacts the auxiliary electrode AE, the auxiliary electrode AE may hold the inorganic bank layer 115. That is, in an embodiment, because the auxiliary electrode AE contacts the inorganic bank layer 115 through the first contact hole CNT1, the layer-floating defects of the inorganic bank layer 115 may be prevented. Accordingly, the display apparatus 1 according to an embodiment may increase reliability and implement high-quality images by preventing the layer-floating defects.

In an embodiment, the metal bank layer 300 may include first to third openings OP1, OP2, and OP3 respectively overlapping the third to third sub-pixel electrodes 1210, 2210, and 3210. The first to third openings OP1, OP2, and OP3, respectively, of the metal bank layer 300 of FIG. 5 may each have the same structure as the opening OP (see FIG. 3F) described above with reference to FIG. 3F.

As an example, in an embodiment, the first to third openings OP1, OP2, and OP3, respectively, may each pass through the bottom surface from the upper surface of the metal bank layer 300 and have a cross-sectional structure of an undercut shape. In an embodiment, the lateral surface of the first metal layer 310 facing a relevant opening among the first to third openings OP1, OP2, and OP3, respectively, of the metal bank layer 300 may have a forward tapered shape and have a slope angle equal to or greater than about 60° and less than about 90°. In an embodiment, the second metal layer 320 of the metal bank layer 300 may include the first tip PT1 extending to a relevant opening among the first to third openings OP1, OP2, and OP3, respectively. In an embodiment, the length of the first tip PT1 may be about 2 μm or less. In an embodiment, the length of the first tip PT1 may be about 0.3 μm to about 1 μm, or about 0.3 μm to about 0.7 μm.

In an embodiment, the first opposite electrode 1230 disposed in the first opening OP1 of the metal bank layer 300, the second opposite electrode 2230 disposed in the second opening OP1 of the metal bank layer 300, and the third opposite electrode 3230 disposed in the third opening OP3 of the metal bank layer 300 may be spatially separated from each other. In an embodiment, the first opposite electrode 1230, the second opposite electrode 1230, and/or the third opposite electrode 3230 may be electrically connected to each other and may have the same voltage level. As an example, in an embodiment, the first opposite electrode 1230, the second opposite electrode 2230, and the third opposite electrode 3230 may each have the same voltage level as a voltage (e.g., a common voltage) provided by the auxiliary line VSL.

In the display apparatus 1 according to an embodiment, the first to third intermediate layers 1220, 2220, and 3220, respectively, and the first to third opposite electrodes 1230, 2230, and 3230, respectively, may be deposited due to the structure of the metal bank layer 300 including the first to third openings OP1, OP2, and OP3, respectively, having the undercut structure without using a separate mask when forming the first to third intermediate layer 1220, 2220, and 3220, respectively, and the first to third opposite electrodes 1230, 2230, and 3230, respectively. Accordingly, damage to the display apparatus 1 due to the mask may be prevented.

In an embodiment, because a material forming the intermediate layer and/or a material forming the opposite electrode may be deposited without using a mask, the material forming the intermediate layer and/or the material forming the opposite electrode may be deposited in a relevant opening among the first to third openings OP1, OP2, and OP3, respectively, and/or deposited on the metal bank layer 300. In an embodiment, at least one dummy intermediate layer and at least one dummy opposite electrode may be disposed on the metal bank layer 300. The at least one dummy intermediate layer may be separated and apart from the first to third intermediate layers 1220, 2220, and 3220 respectively located in the first to third openings OP1, OP2, and OP3. In an embodiment, the at least one dummy opposite electrode may be separated and apart from the first to third intermediate layers 1230, 2230, and 3230 respectively located in the first to third openings OP1, OP2, and OP3. In an embodiment, FIG. 5 shows dummy portions 1220*b* and 1220*c* corresponding to the first dummy intermediate layer and dummy electrode portions 1230*b* and 1230*c* corresponding to the first dummy opposite electrode.

As shown in FIG. 5, in an embodiment, the dummy intermediate layer may include a first dummy intermediate layer 1220*b* arranged in the first sub-pixel area PA1, a second dummy intermediate layer 2220*b* arranged in the second sub-pixel area PA2, and a third dummy intermediate layer 3220*b* arranged in the third sub-pixel area PA3. In an embodiment, the dummy opposite electrode may include a first dummy opposite electrode 1230*b* arranged in the first sub-pixel area PA1, a second dummy opposite electrode 2230*b* arranged in the second sub-pixel area PA2, and a third dummy opposite electrode 3230*b* arranged in the third sub-pixel area PA3.

In an embodiment, because the dummy intermediate layer is separated from the intermediate layer 220 by an undercut structure of the metal bank layer 300, the dummy intermediate layer may include the same material as a material of the intermediate layer 220 in each sub-pixel area. That is, the first dummy intermediate layer 1220*b* may include the same material as a material of the first intermediate layer 1220, the second dummy intermediate layer 2220*b* may include the same material as a material of the second intermediate layer 2220, and/or the third dummy intermediate layer 3220*b* may include the same material as a material of the third intermediate layer 3220. However, in an embodiment, because the first intermediate layer 1220, the second intermediate layer 2220, and/or the third intermediate layer 3220 respectively may include different materials to emit light of different colors, the first dummy intermediate layer 1220*b*, the second dummy intermediate layer 2220*b*, and/or the third dummy intermediate layer 3220*b* may respectively include different materials.

In an embodiment, because the dummy opposite electrode is also separated from the opposite electrode 230 by an undercut structure of the metal bank layer 300, the dummy opposite electrode may include the same material as a material of the opposite electrode 230 in each sub-pixel area. That is, the first dummy opposite electrode 1230*b* may include the same material as a material of the first opposite electrode 1230, the second dummy opposite electrode 2230*b* may include the same material as a material of the second opposite electrode 2230, and/or the third dummy opposite electrode 3230*b* may include the same material as a material of the third opposite electrode 3230. However, in an embodiment, because the first opposite electrode 1230, the second opposite electrode 2230, and/or the third opposite electrode 3230 may include the same material, the first dummy opposite electrode 1230*b*, the second dummy opposite electrode 2230*b*, and/or the third dummy opposite electrode 3230*b* may include the same material. That is, the first opposite electrode 1230, the first dummy opposite electrode 1230*b*, the second opposite electrode 2230, the second dummy opposite electrode 2230*b*, the third opposite electrode 3230, and/or the third dummy opposite electrode 3230*b* may include the same material.

In an embodiment, the capping layer 400 may be disposed on the opposite electrode 230 and/or the dummy opposite electrode. The capping layer 400 may improve an external light-emission efficiency of the first to third light-emitting diodes ED1, ED2, and ED3, respectively. In an embodiment, the capping layer 400 may include a first capping layer 1400 disposed on the first opposite electrode 1230 and/or the first dummy opposite electrode 1230*b*, a second capping layer 2400 disposed on the second opposite electrode 2230 and/or the second dummy opposite electrode 2230*b*, and a third capping layer 3400 disposed on the third opposite electrode 3230 and/or the third dummy opposite electrode 3230*b*. That is, the first capping layer 1400 may be arranged in a region between the first opposite electrode 1230 and a first sub-pixel inorganic encapsulation layer 1510 described below, and/or a region between the first dummy opposite electrode 1230*b* and the first sub-pixel inorganic encapsulation layer 1510. In an embodiment, the second capping layer 2400 may be arranged in a region between the second opposite electrode 2230 and a second sub-pixel inorganic encapsulation layer 2510 described below, and/or a region between the second dummy opposite electrode 2230*b* and the second sub-pixel inorganic encapsulation layer 2510. In an embodiment, the third capping layer 3400 may be arranged in a region between the third opposite electrode 3230 and a third sub-pixel inorganic encapsulation layer 3510 described below, and/or a region between the third dummy opposite electrode 3230*b* and the third sub-pixel inorganic encapsulation layer 3510. In an embodiment, a material of the capping layer 400 may be the same as that described above with reference to FIG. 3K.

In an embodiment, the first to third light-emitting diodes ED1, ED2, and ED3, respectively, may be encapsulated by the encapsulation layer 500. In an embodiment, it is shown in FIG. 5 that the encapsulation layer 500 may include the first inorganic encapsulation layer 510, the organic encapsulation layer 520 on the first inorganic encapsulation layer 510, and/or the second inorganic encapsulation layer 530 on the organic encapsulation layer 520. In an embodiment, the materials of the first inorganic encapsulation layer 510, the organic encapsulation layer 520, and/or the second encapsulation layer 530 may be the same as the materials described above with reference to FIG. 3K.

In an embodiment, the first inorganic encapsulation layer 510 may cover a structure and/or a layer under the first inorganic encapsulation layer 510. As an example, in an embodiment, the first inorganic encapsulation layer 510 having a relatively excellent step coverage may cover an inner structure and/or a layer of each of the plurality of openings OP. In an embodiment, the first inorganic encapsulation layer 510 may include the first sub-pixel inorganic encapsulation layer 1510 covering the inner surface of the first opening OP1, the second sub-pixel inorganic encapsulation layer 2510 covering the inner surface of the second opening OP2, and/or the third sub-pixel inorganic encapsulation layer 3510 covering the inner surface of the third opening OP3. Specifically, in an embodiment, the first sub-pixel inorganic encapsulation layer 1510 may overlap the lateral surface and/or the bottom surface of the second metal layer 320 facing the first opening OP1, the lateral surface of the first metal layer 310 facing the first opening OP1, and/or the upper surface of the first opposite electrode 1230. In an embodiment, the second sub-pixel inorganic encapsulation layer 2510 may overlap the lateral surface and/or the bottom surface of the second metal layer 320 facing the second opening OP2, the lateral surface of the first metal layer 310 facing the second opening OP2, and/or the upper surface of the second opposite electrode 2230. In an embodiment, the third sub-pixel inorganic encapsulation layer 3510 may overlap the lateral surface and/or the bottom surface of the second metal layer 320 facing the third opening OP3, the lateral surface of the first metal layer 310 facing the third opening OP3, and/or the upper surface of the third opposite electrode 3230.

In an embodiment, a portion of the organic encapsulation layer 520 may at least partially fill each of the first to third openings OP1, OP2, and OP3, respectively. That is, because the organic encapsulation layer 520 may include a polymer-based organic material and may have fluidity, the organic encapsulation layer 520 may fill the insides of the first to third openings OP1, OP2, and OP3, respectively. In an embodiment, the organic encapsulation layer 520 may planarize step differences due to the first to third openings OP1, OP2, and OP3, respectively. The second inorganic encapsulation layer 530 may be disposed on the organic encapsulation layer 520.

Figure 6:
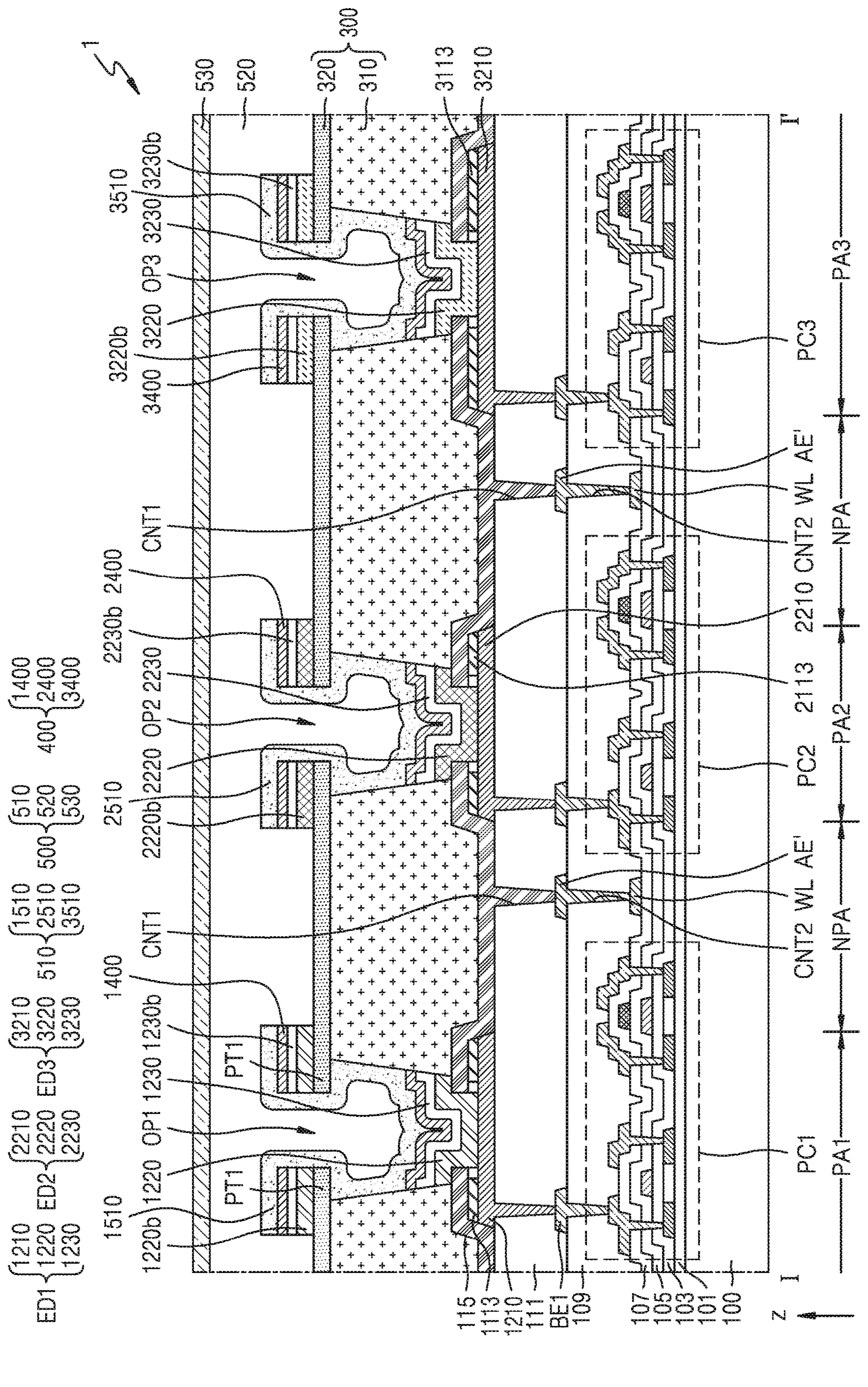
FIG. 6 is a schematic cross-sectional view of a display apparatus according to another embodiment.

FIG. 6 is a schematic cross-sectional view of a display apparatus according to another embodiment. In an embodiment, referring to FIG. 6, other characteristics except those of a first wiring WL and an auxiliary electrode AE' may be the same or similar to as those described with reference to FIGS. 4A to 5. Same reference numerals among elements of FIG. 6 are replaced with those previously described with reference to FIGS. 4A to 5, and differences are mainly described below.

In an embodiment, referring to FIG. 6, the first to third light-emitting diodes ED1, ED2, and ED3, respectively, may be disposed over the substrate 100, and the first to third sub-pixel circuits PC1, PC2, and PC3, respectively, may be disposed between the substrate 100 and the first to third light-emitting diodes ED1, ED2, and ED3, respectively. In an embodiment, the first to third sub-pixel circuits PC1, PC2, and PC3, respectively, may have the same structure as a structure of the sub-pixel circuit PC (see FIG. 3A) described above with reference to FIG. 3A. That is, the first to third sub-pixel circuits PC1, PC2, and PC3, respectively, may each include the first transistor T1 (see FIG. 3A), the sixth transistor T6 (see FIG. 3A), and/or the storage capacitor Cst (see FIG. 3A).

In an embodiment, the first transistor T1 may include the first semiconductor layer A1 (see FIG. 3A), the first gate electrode G1 (see FIG. 3A), the first source electrode S1 (see FIG. 3A), and/or the first drain electrode D1 (see FIG. 3A), wherein the first semiconductor layer A1 may be located on the buffer layer 101, the first gate electrode G1 may overlap the channel region of the first semiconductor layer A1, the first source electrode S1 and/or the first drain electrode D1 may be electrically connected to the first semiconductor layer A1. In an embodiment, the sixth transistor T6 may include the sixth semiconductor layer A6 (see FIG. 3A), the sixth gate electrode G6 (see FIG. 3A), the sixth source electrode S6 (see FIG. 3A), and/or the sixth drain electrode D6 (see FIG. 3A), wherein the sixth semiconductor layer A6 may be located on the buffer layer 101, the sixth gate electrode G6 may overlap the channel region of the sixth semiconductor layer A6, the sixth source electrode S6 and/or the sixth drain electrode D6 may be electrically connected to the sixth semiconductor layer A6.

In an embodiment, the first wiring WL may be disposed substantially on the same layer as a layer on which the source electrodes S1 and S6 and the drain electrodes D1 and D6 described above are disposed and may include the same material as a material of the source electrodes S1 and S6 and/or the drain electrodes D1 and D6. That is, in an embodiment, the first wiring WL may be disposed between the second interlayer insulating layer 107 and the first organic insulating layer 109. In an embodiment, the first wiring WL may include aluminum (Al), copper (Cu), and/or titanium (Ti), and may include a single layer or a multi-layer including the above materials. In addition, in an embodiment, the auxiliary electrode AE' may be disposed between the first organic insulating layer 109 and the second organic insulating layer 111. In an embodiment, the auxiliary electrode AE' may be disposed on the same layer as a layer on which the connection electrode BE1 is disposed and may include the same material as a material of the connection electrode BE1. In an embodiment, the auxiliary electrode AE' may include aluminum (Al), copper (Cu), and/or titanium (Ti), and may include a single layer or a multi-layer including the above materials.

In an embodiment, in the structure of FIG. 6, the first wiring WL may be the auxiliary line VSL (see FIG. 2A) or the data line DL (see FIG. 2A). In an embodiment, the auxiliary electrode AE' may be configured to transfer signals of the first wiring WL, wherein the auxiliary electrode AE may be electrically connected to the first wiring WL through a second contact hole CNT2.

In an embodiment, the bottom surface of the auxiliary electrode AE' may be connected to the first wiring WL through the second contact hole CNT2. That is, in an embodiment, the first wiring WL may directly contact the auxiliary electrode AE' through the second contact hole CNT2 passing through the first organic insulating layer 109. As described above, in an embodiment, the bottom surface of the inorganic bank layer 115 may contact the auxiliary electrode AE' through the first contact hole CNT1. That is, in an embodiment, the auxiliary electrode AE' may directly contact the inorganic bank layer 115 through the first contact hole CNT1 passing through the second organic insulating layer 111. As shown in FIG. 5, in an embodiment, the auxiliary electrode AE' and/or the first wiring WL may be disposed between adjacent light-emitting diodes or between adjacent sub-pixel circuits. As an example, in an embodiment, the auxiliary electrode AE' and the first wiring WL may be disposed between the first sub-pixel area PA1 and the second sub-pixel area PA2, between the second sub-pixel area PA2 and the third sub-pixel area PA3, and/or between the third sub-pixel area PA3 and the first sub-pixel area PA1. Accordingly, in an embodiment, the inorganic bank layer 115 may contact the auxiliary electrode AE' through the first contact hole CNT1 in the non-sub-pixel area NPA, and the auxiliary electrode AE' may contact the first wiring WL through the second contact hole CNT2 in the non-sub-pixel area NPA.

As described above, there is a danger that a layer-floating defect may occurs between the second organic insulating layer 111 and the inorganic bank layer 115 arranged in the non-sub-pixel area NPA. However, as in FIG. 6, in an embodiment, because the second contact hole CNT2 and the first contact hole CNT1 are respectively formed in the first organic insulating layer 109 and the second organic insulating layer 111 of the non-sub-pixel area NPA, the layer-floating defects may be prevented. Specifically, because the inorganic bank layer 115 contacts the auxiliary electrode AE', the auxiliary electrode AE' may hold the inorganic bank layer 115, and in addition, because the auxiliary electrode AE' contacts even the first wiring WL, the auxiliary electrode AE' may hold the inorganic bank layer 115 more strongly. Accordingly, the display apparatus according to another embodiment may increase reliability and implement high-quality images by preventing the layer-floating defect more effectively.

In the display apparatus according to an embodiment, resolution may be improved by patterning the intermediate layer and the opposite electrode using the metal bank layer. Furthermore, in an embodiment, because a contact hole may be formed between the auxiliary electrode and the inorganic bank layer, layer-floating defects of the inorganic bank layer may be prevented. However, this effect is an example, and the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

While the present disclosure has been particularly shown and described with reference to embodiments thereof, it will be understood by those of ordinary skill in the art that various changes in form and details may be made therein without departing from the spirit and scope of the present disclosure as defined by the appended claims. The embodiments should be considered in a descriptive sense only and not for purposes of limitation. For example, each element described as a single type may be distributed, and similarly, elements described to be distributed may be combined. Moreover, the embodiment or parts of the embodiments may be combined in whole or in part without departing from the scope of the invention.

What is claimed is:

1. A display apparatus comprising:

a substrate including a plurality of sub-pixel areas and a non-sub-pixel area surrounding each of the plurality of sub-pixel areas, wherein the plurality of sub-pixel areas correspond to a plurality of sub-pixels including a first sub-pixel, a second sub-pixel, and a third sub-pixel, wherein each of the first sub-pixel, second sub-pixel and third sub-pixel are configured to emit light of a different color;

a first sub-pixel electrode disposed over the substrate;

a metal bank layer including a first opening, a first metal layer, and a second metal layer on the first metal layer, wherein the first opening overlaps the first sub-pixel electrode;

an inorganic bank layer disposed on the first sub-pixel electrode and disposed under the metal bank layer;

a first intermediate layer overlapping the first sub-pixel electrode through the first opening of the metal bank layer;

a first opposite electrode disposed on the first intermediate layer through the first opening of the metal bank layer; and an auxiliary electrode overlapping the metal bank layer in the non-sub-pixel area, wherein a bottom surface of the inorganic bank layer is in contact with the auxiliary electrode through a first contact hole, the inorganic bank layer passing through the first contact hole to contact the auxiliary electrode.

2. The display apparatus of claim 1, further comprising:

a thin-film transistor disposed on the substrate;

a first organic insulating layer covering the thin-film transistor;

a connection electrode disposed on the first organic insulating layer to electrically connect the thin-film transistor with the first sub-pixel electrode; and a second organic insulating layer disposed between the connection electrode and the first sub-pixel electrode.

3. The display apparatus of claim 2, wherein the second organic insulating layer defines the first contact hole such that the first contact hole passes through the second organic insulating layer.

4. The display apparatus of claim 2, wherein the auxiliary electrode includes a material that is the same as a material of the connection electrode, wherein the auxiliary electrode and the connection electrode are disposed on a same layer.

5. The display apparatus of claim 4, further comprising a first wiring including a material that is the same as a material of a source electrode or a drain electrode of the thin-film transistor, wherein the first wiring is disposed on a same layer as the source electrode or the drain electrode, wherein the auxiliary electrode is connected to the first wiring through a second contact hole, and wherein the first organic insulating layer defines the second contact hole such that the second contact hole passes through the first organic insulating layer.

6. The display apparatus of claim 1, further comprising:

a second sub-pixel electrode;

a second intermediate layer overlapping the second sub-pixel electrode through a second opening of the metal bank layer; and a second opposite electrode overlapping the second intermediate layer through the second opening of the metal bank layer, wherein the auxiliary electrode is disposed between the first sub-pixel electrode and the second sub-pixel electrode.

7. The display apparatus of claim 6, wherein the inorganic bank layer extends to cover an end of the first sub-pixel electrode and an end of the second sub-pixel electrode.

8. The display apparatus of claim 1, wherein the first sub-pixel and the third sub-pixel are alternately arranged along a first row in a first direction, the second sub-pixel is arranged along a second row in a direction parallel to the first row in the first direction, and the second sub-pixel is alternately arranged with the first sub-pixel and the third sub-pixel.

9. The display apparatus of claim 8, wherein the auxiliary electrode is disposed in the non-sub-pixel area and extends in a zigzag pattern shape in the first direction.

10. The display apparatus of claim 1, wherein the first contact hole extends into a portion of a pattern in which the auxiliary electrode is arranged.

11. The display apparatus of claim 1, wherein, the first contact hole is arranged in a straight line form along a pattern in which the auxiliary electrode is arranged.

12. The display apparatus of claim 1, wherein the first opposite electrode is disposed to be in contact with a lateral surface of the metal bank layer to face the first opening.

13. The display apparatus of claim 1, wherein a portion of the second metal layer facing the first opening includes a tip extending to the first opening from a point at which a bottom surface of the second metal layer contacts a lateral surface of the first metal layer.

14. The display apparatus of claim 1, further comprising a conductive protective layer disposed between the inorganic bank layer and an outer portion of the first sub-pixel electrode, wherein the conductive protective layer includes a transparent conductive oxide.

15. The display apparatus of claim 1, further comprising:

a first dummy intermediate layer including a material that is the same as a material of the first intermediate layer, and disposed on the second metal layer; and a first dummy opposite electrode including a material that is the same as a material of the first opposite electrode, and disposed on the first dummy intermediate layer.

16. A display apparatus comprising:

a substrate including a plurality of sub-pixel areas and a non-sub-pixel area surrounding each of the plurality of sub-pixel areas, wherein the plurality of sub-pixel areas correspond to a plurality of sub-pixels including a first sub-pixel, a second sub-pixel, and a third sub-pixel each configured to emit light of a different color;

a first organic insulating layer disposed on the substrate;

a connection electrode disposed on the first organic insulating layer;

an auxiliary electrode disposed on the first organic insulating layer and disposed adjacent to the connection electrode;

a second organic insulating layer disposed to cover the connection electrode and the auxiliary electrode;

a sub-pixel electrode disposed on the second organic insulating layer;

an inorganic bank layer including an opening overlapping the sub-pixel electrode, wherein the inorganic bank layer is disposed on the sub-pixel electrode; and a metal bank layer including an opening overlapping the sub-pixel electrode, wherein the metal bank layer is disposed on the inorganic bank layer and includes a first metal layer and a second metal layer disposed on the first metal layer, wherein the sub-pixel electrode is connected to the connection electrode through a via hole defined by the second organic insulating layer, and the inorganic bank layer is in contact with the auxiliary electrode through a first contact hole defined by the second organic insulating layer, the inorganic bank layer passing through the first contact hole to contact the auxiliary electrode.

17. The display apparatus of claim 16, further comprising:

an intermediate layer overlapping the sub-pixel electrode through the opening of the metal bank layer;

an opposite electrode disposed on the intermediate layer through the opening of the metal bank layer;

a dummy intermediate layer including a material that is the same as a material of the intermediate layer, and disposed on the metal bank layer; and a dummy opposite electrode including a material that is the same as a material of the opposite electrode, and disposed on the dummy intermediate layer.

18. The display apparatus of claim 16, further comprising:

a thin-film transistor disposed between the substrate and the first organic insulating layer; and a first wiring, wherein the first wiring is disposed on a same layer which a source electrode or a drain electrode of the thin-film transistor is disposed, wherein the auxiliary electrode is electrically connected to the first wiring through a second contact hole defined by the first organic insulating layer.

19. The display apparatus of claim 16, wherein the first contact hole extends into a portion of a pattern in which the auxiliary electrode is arranged.

20. The display apparatus of claim 16, wherein, the first contact hole is arranged in a straight line form along a pattern in which the auxiliary electrode is arranged.

* * * * *